(12) United States Patent
Yeh et al.

(10) Patent No.: US 9,768,313 B2
(45) Date of Patent: Sep. 19, 2017

(54) DEVICES HAVING TRANSITION METAL DICHALCOGENIDE LAYERS WITH DIFFERENT THICKNESSES AND METHODS OF MANUFACTURE

(71) Applicant: Taiwan Semiconductor Manufacturing Company, Ltd., Hsin-Chu (TW)

(72) Inventors: Ling-Yen Yeh, Hsin-Chu (TW); Chao Hsiung Wang, Hsin-Chu (TW); Yee-Chia Yeo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/874,879

(22) Filed: Oct. 5, 2015

(65) Prior Publication Data

US 2017/0098717 A1    Apr. 6, 2017

(51) Int. Cl.
*H01L 29/06*    (2006.01)
*H01L 29/786*    (2006.01)
(Continued)

(52) U.S. Cl.
CPC ...... *H01L 29/78681* (2013.01); *H01L 21/308* (2013.01); *H01L 21/3065* (2013.01);
(Continued)

(58) Field of Classification Search
CPC ............ H01L 29/78681; H01L 27/088; H01L 29/78618; H01L 21/8256; H01L 21/3065; H01L 29/78696; H01L 29/24; H01L 21/308

See application file for complete search history.

(56) References Cited

U.S. PATENT DOCUMENTS 5,479,033 A * 12/1995 Baca ...................... H01L 29/802
257/192
6,683,362 B1 * 1/2004 O ........................ H01L 27/0629
257/368

(Continued)

FOREIGN PATENT DOCUMENTS

TW    201501308    1/2015
WO    2012093360 A1    7/2012

OTHER PUBLICATIONS

Liu, et al., "Layer-by-Layer Thinning of MoS2 by Plasma," American Chemical Society, vol. 7, No. 5, accepted Apr. 2, 2013, 8 pages.*

(Continued)

*Primary Examiner* — Phat X Cao
*Assistant Examiner* — Mohammad M Hoque
(74) *Attorney, Agent, or Firm* — Slater Matsil, LLP

(57) ABSTRACT

An embodiment is a structure including a first active device in a first region of a substrate, the first active device including a first layer of a two-dimensional (2-D) material, the first layer having a first thickness, and a second active device in a second region of the substrate, the second active device including a second layer of the 2-D material, the second layer having a second thickness, the 2-D material including a transition metal dichalcogenide (TMD), the second thickness being different than the first thickness.

21 Claims, 34 Drawing Sheets

(51) Int. Cl.
H01L 21/3065 (2006.01)
H01L 21/308 (2006.01)
H01L 21/8256 (2006.01)
H01L 27/088 (2006.01)
H01L 29/24 (2006.01)

(52) U.S. Cl.
CPC ........ H01L 21/8256 (2013.01); H01L 27/088 (2013.01); H01L 29/24 (2013.01); H01L 29/78618 (2013.01); H01L 29/78696 (2013.01)

(56) References Cited

U.S. PATENT DOCUMENTS

| | | | |
|---|---|---|---|
| 9,147,824 B1* | 9/2015 | Cao | H01L 21/02485 |
| 2008/0064156 A1* | 3/2008 | Ikeda | H01L 21/28255 438/199 |
| 2013/0092984 A1 | 4/2013 | Liu et al. | |
| 2014/0367741 A1 | 12/2014 | Yang et al. | |
| 2015/0287600 A1* | 10/2015 | Chang | H01L 21/2654 257/510 |
| 2016/0047059 A1* | 2/2016 | Kim | H01L 21/02381 438/199 |

OTHER PUBLICATIONS

Amara, et al., "Wet chemical thinning of molybdenum disulfide down to its monolayer," APL Materials 2, http:/dx.doi.org/10.1063/1.4893962, Published Aug. 28, 2014, 8 pages.

Fischl, et al., "Molybdenum etching with chlorine atoms and molecular chlorine plasmas," Journal of Vacuum Science & Technology B 6, Accepted Jun. 25, 1988, 5 pages.

Kong, et al., "Synthesis of MoS2 and MoSe2 Films with Vertically Aligned Layers," NANO letters, ACS Publications, Published Feb. 6, 2013, 7 pages.

Kuo, et al., "Slope control of molybdenum lines etched with reactive ion etching," Journal of Vacuum Science & Technology A 8, Accepted Oct. 30, 1989 (1990), 5 pages.

Ling, et al., "Role of the Seeding Promoter in MoS2 Growth by Chemical Vapor Deposition," ACS Publications, Published Jan. 29, 2014, 9 pages.

Westerheim, et al., "Substrate bias effects in high-aspect-ratio SiO2 contact etching using an inductively coupled plasma reactor," Journal of Vacuum Science & Technology A 13, Accepted Nov. 14, 1994, (1995), 7 pages.

Zhan, et al., "Large Area Vapor Phase Growth and Characterization of MoS2 Atomic Layers on SiO2 Substrate," Department of Mechanical Engineering & Materials Science, Published Feb. 15, 2012, 24 pages.

Zhao, et al., "Air Stable p-Doping of WSe2 by Covalent Functionalization," American Chemical Society, vol. 8, No. 10, Accepted Sep. 17, 2014, Published online Sep. 17, 2014, 9 pages.

Wu, et al., "Stacked 3-D Fin-CMOS Technology," IEEE Electron Device Letters, vol. 26, No. 6, Jun. 2005, 3 pages.

* cited by examiner

DEVICES HAVING TRANSITION METAL DICHALCOGENIDE LAYERS WITH DIFFERENT THICKNESSES AND METHODS OF MANUFACTURE

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

In recent development of transistors, Transition Metal Dichalcogenide (TMD) materials are used for forming the transistors. The TMD materials form the active regions, which include the channel regions and source and drain regions. However, TMD materials are semiconductor materials, and hence the contact resistance to the source and drain regions is high.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
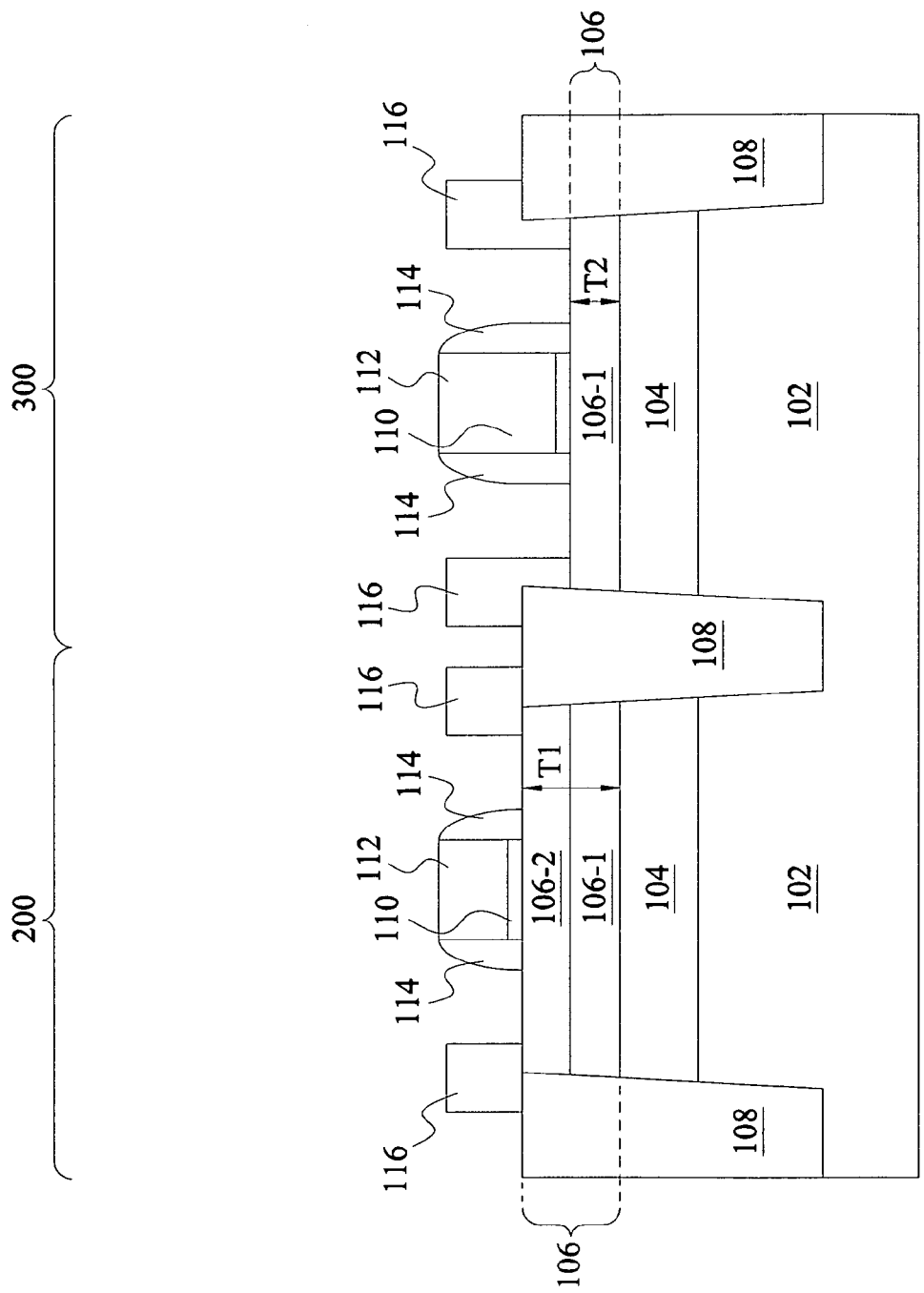
FIGS. 1A and 1B are a cross-sectional view and a top view, respectively, of a device having transition metal dichalcogenide (TMD) channels in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally. In general terms, the present disclosure is device and method of forming the same to provide devices with various thickness two-dimensional (2-D) material layers on the same substrate, such as, for example, providing transistors with various thickness channels on the same substrate. In particular, embodiments such as those disclosed below have channels formed of various thicknesses of a 2-D material layer. The 2-D material layer may be a transition metal dichalcogenide (TMD) material layer. It has been found that the value of the energy band gap of the TMD layer in each transistor strongly depends on the thickness of the TMD layer. Hence, device characteristics which are affected by the energy band gap can be adjusted in each transistor separately even while these devices are formed on the same die/chip. These characteristics include threshold voltage, on-state current, the ratio of (on-state current/off-state current), and contact conductivity. The overall performance of the integrated circuit including the devices can be further optimized with the embodiments of this disclosure.

For example, in some embodiments, a TMD layer with a first thickness is formed on a surface of a substrate. The TMD layer may include a plurality of TMD sublayers. A mask material is then deposited on the TMD layer and patterned to expose a portion of the TMD layer. Next, the exposed TMD layer is etched to a second thickness layer by layer and then the mask material is removed. The different thicknesses of transistor channels across a die/chip can be realized by repeating this masking-patterning-etching process.

With reference now to FIG. 1A, there is illustrated a first region 200 and a second region 300 with both regions having a substrate 102, an optional insulator layer 104, a transition metal dichalcogenide (TMD) layer 106, isolation regions 108, a gate dielectric 110, a gate electrode 112, gate spacers 114, and contacts 116. The first region 200 includes a first transistor and the second region 300 includes a second transistor. In some embodiments, the first transistor and the second transistor have different performance characteristics, and in another embodiment, the first transistor and the second transistor have the same performance characteristics.

Although only two regions of the substrate 102 are shown (the first region 200 and second region 300), in another embodiment, the number of regions may be any number, such as more than two (e.g. four, six, eight, or more regions).

In an embodiment the substrate 102 may comprise bulk silicon, doped or undoped, or an active layer of a silicon-on-insulator (SOI) substrate. Generally, an SOI substrate includes a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The optional insulator layer 104 may be formed over the substrate 102. The insulator layer 104 may be an oxide, such as silicon oxide, aluminum oxide, the like, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. An anneal process may be performed once the insulator layer 104 is formed. Further, a planarization process, such as a chemical mechanical polish (CMP), may remove any excess insulator layer 104 material and form a planar top surface for insulator layer 104.

The TMD layer 106 is a transition metal dichalcogenide material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the TMD layer 106 include $MoS_2$, $WS_2$, $WSe_2$, $MoSe_2$, $MoTe_2$, $WTe_2$, the like, or a combination thereof. However, any suitable transition metal dichalcogenide material may alternatively be used. Once formed, the transition metal dichalcogenide material is in a layered structure with a plurality of two-dimensional layers of the general form X-M-X, with the chalcogen atoms in two planes separated by a plane of metal atoms.

The TMD layer 106 may include a plurality of TMD sublayers (e.g. two or more TMD sublayers, see TMD sublayers 106-1 and 106-2). In the illustrated embodiment, the first region 200 has two TMD sublayers 106-1 and 106-2 (i.e. bilayer structure) and the second region 300 has a single TMD layer 106-1 (i.e. monolayer structure). Each of the TMD sublayers 106-1 and 106-2 include a 2-D material having a non-zero band gap. In this embodiment, the first region has a TMD layer 106 of a first thickness T1 and the second region 300 has a TMD layer 106 of a second thickness T2, with the first thickness T1 being larger than the second thickness T2. As discussed above, the value of the energy band gap of the TMD layer in each region strongly depends on the thickness of the TMD layer, and thus, the first region 200 and the second region 300 have different energy band gaps and can have devices with different performance characteristics. In an embodiment, the first thickness T1 is in a range from about 0.65 nm to about 6.5 nm, and the second thickness T2 is in a range from about 1.3 nm to about 7.15 nm.

In an example where the TMD sublayer 106-1 is $MoS_2$, the TMD sublayer 106-1 may, by itself (e.g. in an absence of TMD sublayer 106-2), be a direct band gap material layer having a band gap of about 1.8 eV, as an example. In like manner, in an example where the TMD sublayer 106-2 is $MoS_2$, the TMD sublayer 106-2 may, by itself (e.g. in an absence of the TMD sublayer 106-1), be a direct band gap material layer having a band gap of about 1.8 eV, as an example. However, when the TMD sublayer 106-2 is disposed over the TMD sublayer 106-1 to form the multi-layer TMD material structure of the TMD layer 106 (as in the first region 200 in the example of FIG. 1A), an interlayer bond may formed (e.g. by van der Waals forces) between the TMD sublayer 106-1 and the TMD sublayer 106-2. This may cause the TMD layer 106, which includes the TMD sublayer 106-1 and the TMD sublayer 106-2, to have an indirect band gap of about 1.29 eV. Hence, in the example using $MoS_2$ in FIG. 1A, the TMD layer 106 in region 200 can have an indirect band gap of about 1.29 eV, and the TMD layer 106 in the second region 300 can have a direct band gap of about 1.8 eV.

Although the first region 200 and second region 300 are shown with two TMD sublayers and one TMD sublayer, respectively, in another embodiment, the number of TMD sublayers of the TMD layer 106 in each of the regions may be any number, such as more than two (e.g. four, six, eight, or more TMD sublayers).

The isolation regions 108 may be formed over the substrate 102 are may be used to isolate the first region 200 and the second region 300 from each other and adjacent regions (not shown). The isolation regions 108 may be an oxide, such as silicon oxide, aluminum oxide, the like, a nitride, the like, or a combination thereof, and may be formed by a HDP-CVD, a FCVD (e.g., a CVD-based material deposition in a remote plasma system and post curing to make it convert to another material, such as an oxide), the like, or a combination thereof. Other insulation materials formed by any acceptable process may be used. An anneal process may be performed once the isolation regions 108 are formed. Further, a planarization process, such as a CMP, may remove any excess isolation regions 108 material and form a planar top surface for the isolation regions 108.

Gate stacks are formed over the TMD layers 106 in the first region 200 and the second region 300. The gate stacks include gate dielectrics 110 and gate electrodes 112. The gate dielectrics 110 may include silicon oxide, silicon nitride, or multilayers thereof. In some embodiments, gate dielectric 110 include a high-k dielectric material, and in these embodiments, gate dielectrics 110 may have a k value greater than about 7.0, and may include a metal oxide or a silicate of Hf, Al, Zr, La, Mg, Ba, Ti, Pb, and combinations thereof. The formation methods of gate dielectrics may include molecular-beam deposition (MBD), atomic layer deposition (ALD), plasma-enhanced chemical vapor deposition (PECVD), and the like.

Gate electrodes 112 are deposited over gate dielectrics 110 in the first region 200 and the second region 300. The gate electrodes 112 may include polysilicon or the like. In some embodiments, the gate electrodes 112 may be made of a metal-containing material such as TiN, TaN, TaC, Co, Ru, Al, combinations thereof, or multi-layers thereof.

The contacts 116 are formed to have at least a portion of the contact 116 contacting with the TMD layer 106. For example, each of the first and second regions 200 and 300 may include a source contact 116 and a drain contact 116 formed over the topmost TMD sublayer (106-2 in first region 200 and 106-1 in second region 300). The source contact 116 and the drain contact 116 for each of the regions may be laterally separated from each other, as shown in FIG. 1A. The source contact 116 and the drain contact 116 may include copper, aluminum, palladium, silver, nickel, gold, titanium, gadolinium, alloys thereof, or the like.

In some embodiments, the structures of each of the first region 200 and the second region 300 may be a transistor (e.g. a field effect transistor) having a 2-D material structure (e.g. the TMD layer 106). In operation, a channel may be formed in the TMD layer 106, e.g. in response to voltages supplied to or applied by gate electrode 112 such that current may flow between the source contact 116 and the drain contact 116. As an example, the channel may be formed in a portion of the TMD layer 106 below the gate stack 112 and 110 and between the source contact 116 and the drain contact 116.

Figure 1B:
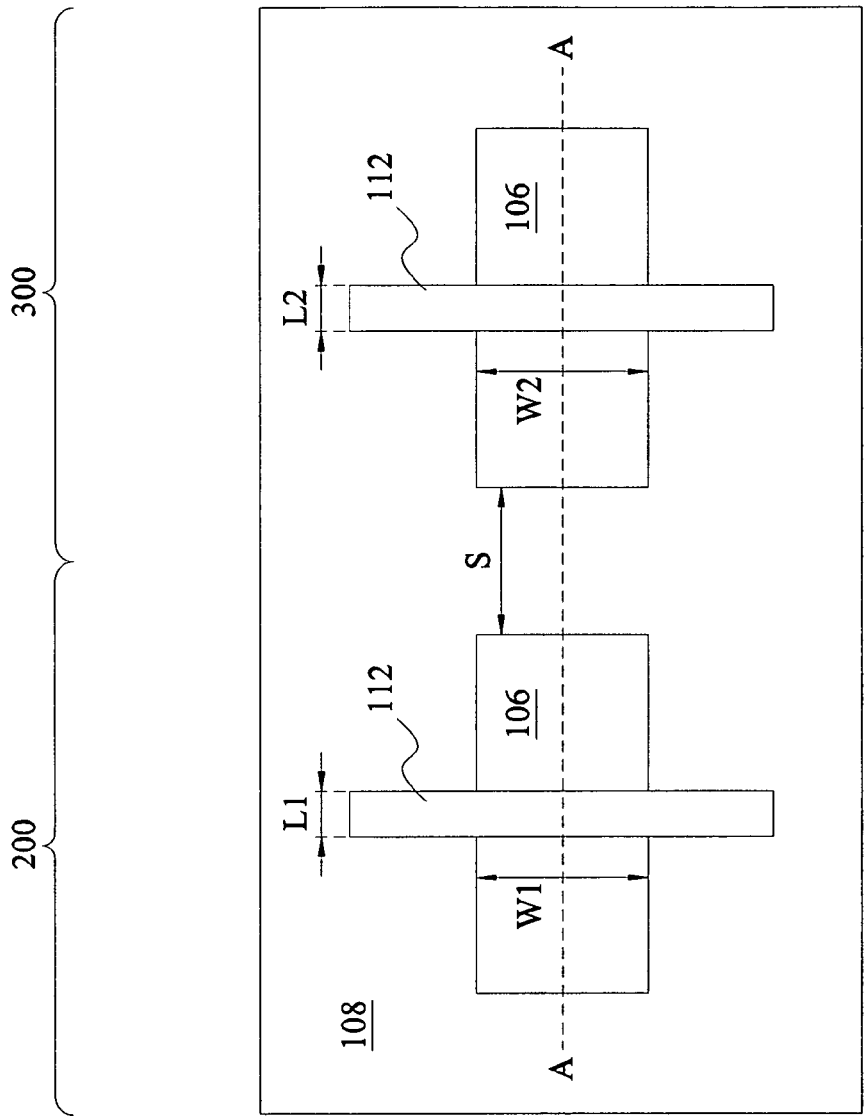

FIG. 1B illustrates a top-view of the structure in FIG. 1A before the contacts 116 are formed FIG. 1A is a cross-sectional view along the line A-A of FIG. 1B. In an embodiment, the transistor in the first region 200 has a channel width of W1 and a channel length of L1, and the transistor in the second region 300 has a channel width of W2 and a channel length of L2. The two transistors are separated by a spacing S. In some embodiments, the channel length L1 is at least 1 nm, at least 3 nm, or at least 10 nm. In some embodiments, the channel length L2 is at least 1 nm, at least 3 nm, or at least 10 nm. In some embodiments, the spacing S is at least 3 nm, at least 5 nm, or at least 10 nm.

Figure 2:
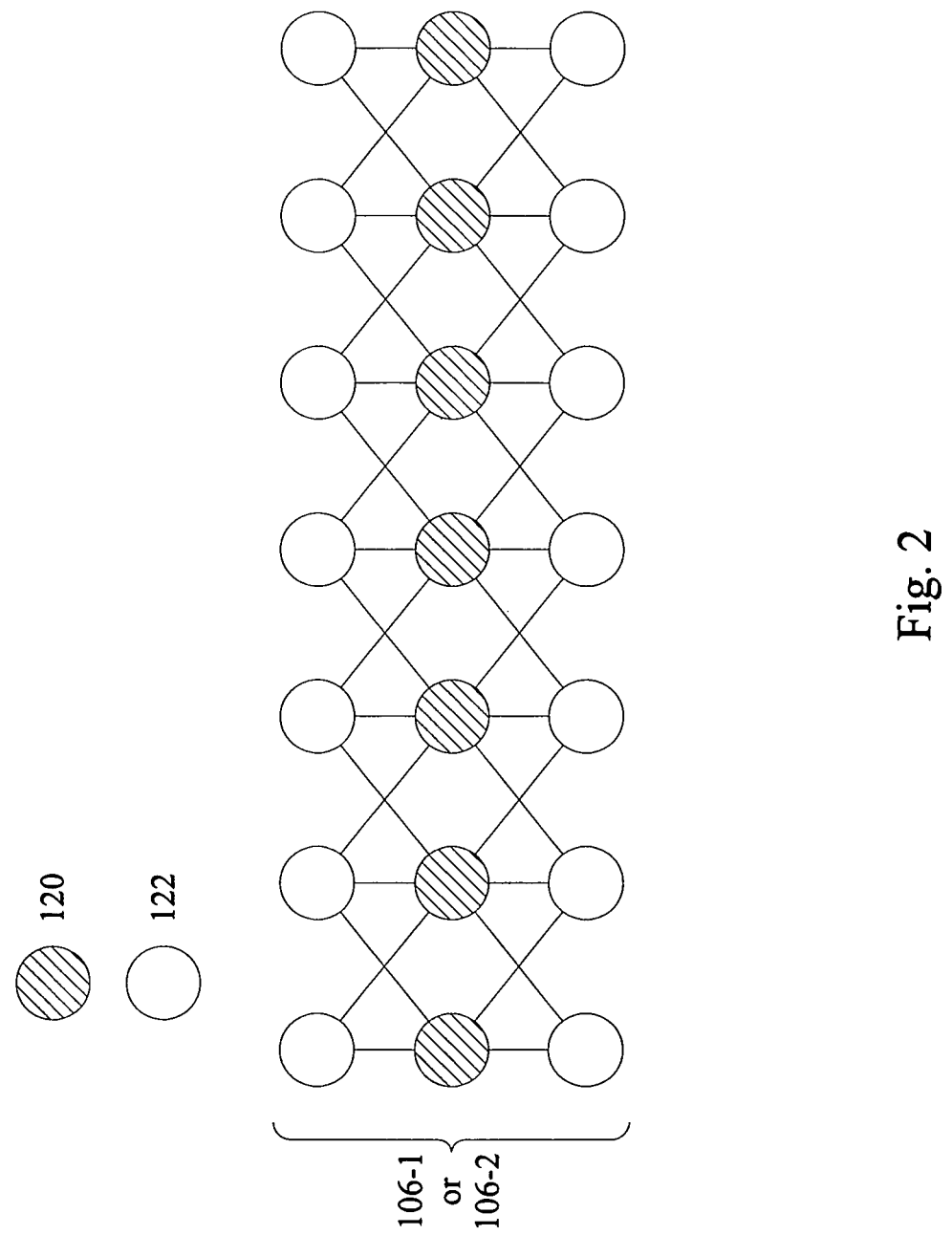
FIG. 2 illustrates a schematic representation of a TMD layer in accordance with some embodiments.

FIG. 2 illustrates a schematic representation of one of the TMD sublayers 106-1 and 106-2 in accordance with some embodiments. As shown in FIG. 2, the TMD sublayer may include a one-molecule thick TMD material layer in accordance with some exemplary embodiments. As an example, the TMD sublayer 106-1 may have a bonding structure similar to the schematic representation shown in FIG. 2. In like manner, the TMD sublayer 106-2 may have a bonding structure similar to the schematic representation shown in FIG. 2. As shown in FIG. 2, the one-molecule thick TMD material layer comprises transition metal atoms 120 and chalcogen atoms 122. The transition metal atoms 120 may form a layer in a middle region of the one-molecule thick TMD material layer, and the chalcogen atoms 122 may form a first layer over the layer of transition metal atoms 120, and a second layer underlying the layer of transition metal atoms 120. The transition metal atoms 120 may be W atoms or Mo atoms, while the chalcogen atoms 122 may be S atoms, Se atoms, or Te atoms. In the example of FIG. 2, each of the transition metal atoms 120 is bonded (e.g. by covalent bonds) to six chalcogen atoms 122, and each of the chalcogen atoms 122 is bonded (e.g. by covalent bonds) to three transition metal atoms 120.

Figure 3:
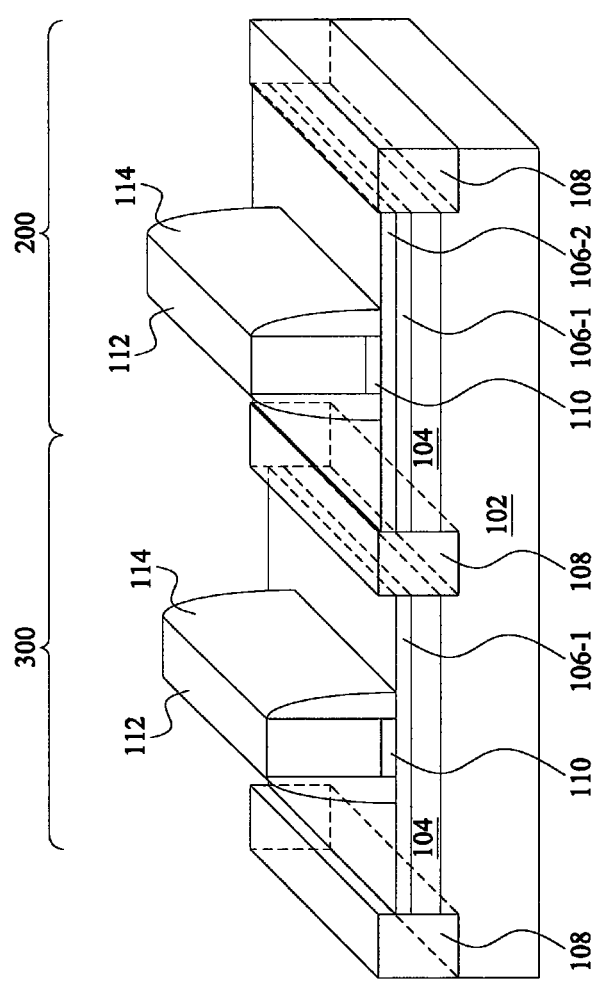
FIG. 3 is a perspective view of a device having TMD channels on an insulator layer in accordance with some embodiments.

FIG. 3 is a perspective view of a device having TMD channels on an insulator layer 104 in accordance with some embodiments. The device illustrated in FIG. 3 is similar to the device illustrated in FIG. 1A and 1B the description is not repeated herein.

Figure 4:
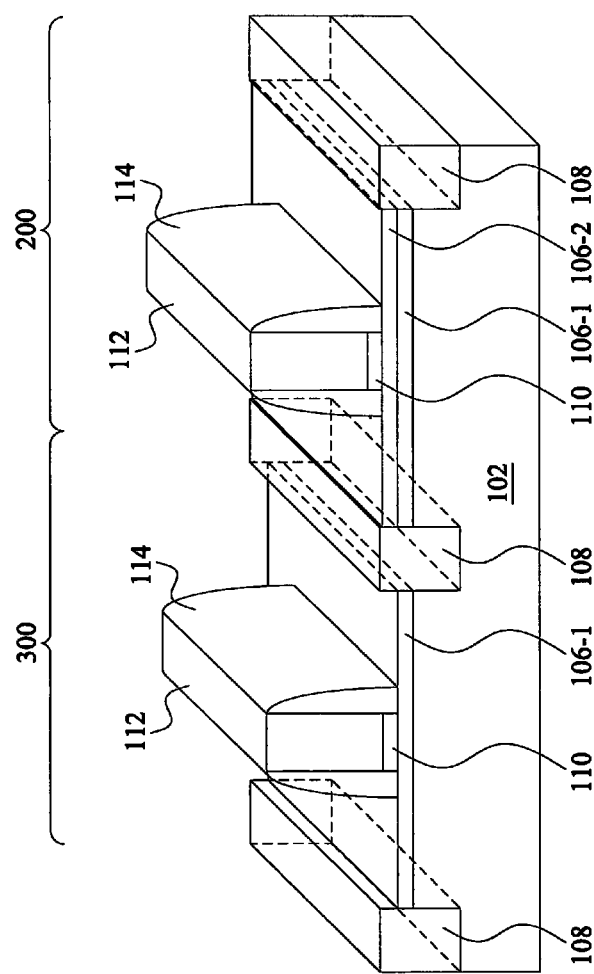
FIG. 4 is a perspective view of a device having TMD channels in accordance with some embodiments.

FIG. 4 is a perspective view of a device having TMD channels in accordance with some embodiments. The device illustrated in FIG. 4 is similar to the devices illustrated in FIGS. 1A, 1B, and 3 except that it does not include the insulator layer 104 below the TMD layers 106. In this embodiment, the TMD layers 106 are directly adjoining the substrate 102. The remaining structures of the device are similar to those described above embodiments and the description is not repeated herein.

FIGS. 5 through 10 and 12 through 16 are cross-sectional views of intermediate steps during a process for forming a device structure in accordance with some embodiments. Some variations of embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

Figure 5:
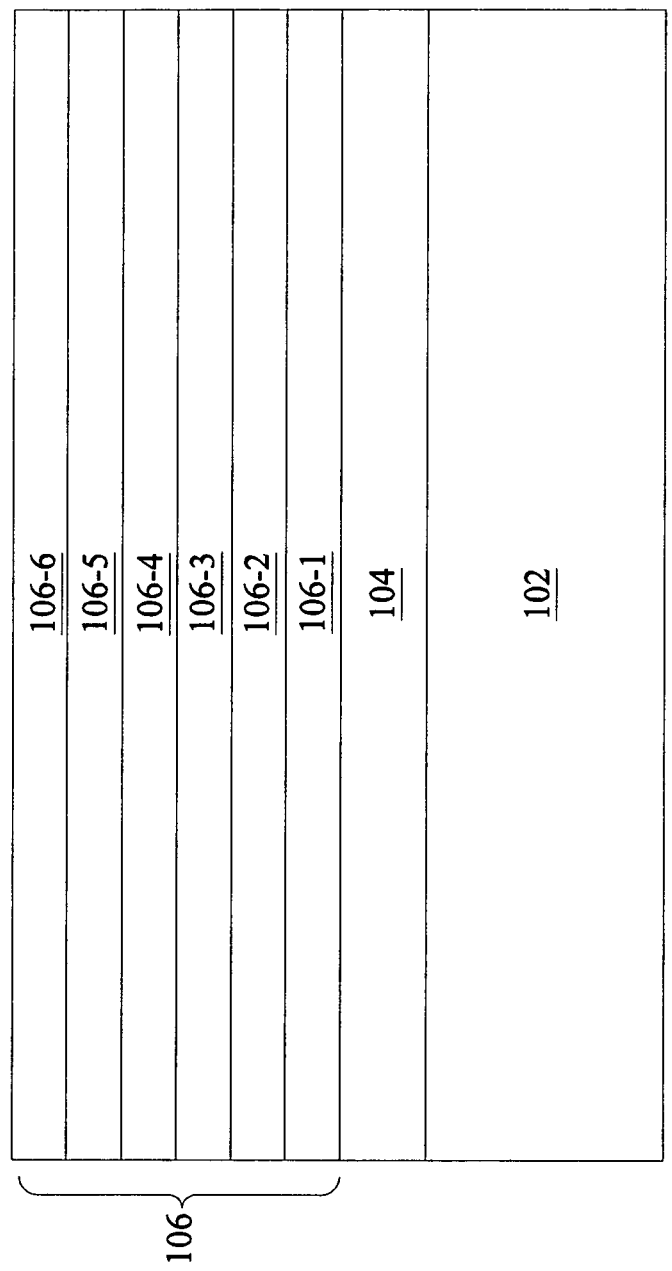
FIGS. 5 through 10 and 12 through 16 are cross-sectional views of intermediate steps during a process for forming a device structure in accordance with some embodiments.

FIG. 5 illustrates a structure including the substrate 102, the insulator layer 104 over the substrate, and a plurality of TMD sublayers 106-1 through 106-6 over the insulator layer 104. The substrate 102 and the insulator layer 104 were previously described above and their descriptions are not repeated herein.

The TMD layer 106 is a dichalcogenide material which has the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the TMD layer 106 include $MoS_2$, $WS_2$, $WSe_2$, $MoSe_2$, $MoTe_2$, $WTe_2$, the like, or a combination thereof. However, any suitable transition metal dichalcogenide material may alternatively be used. Once formed, the dichalcogenide material is in a layered structure with a plurality of two-dimensional layers of the general form X-M-X, with the chalcogen atoms in two planes separated by a plane of metal atoms.

The TMD sublayers 106-1 through 106-6 may be formed by chemical or mechanical transfer, CVD, ALD, the like, or a combination thereof. The details of the methods of forming one of the TMD sublayers 106 is described below. These processes may be repeated as necessary to form a TMD layer 106 of the desired thickness for the design of the transistor or region.

Figure 30:
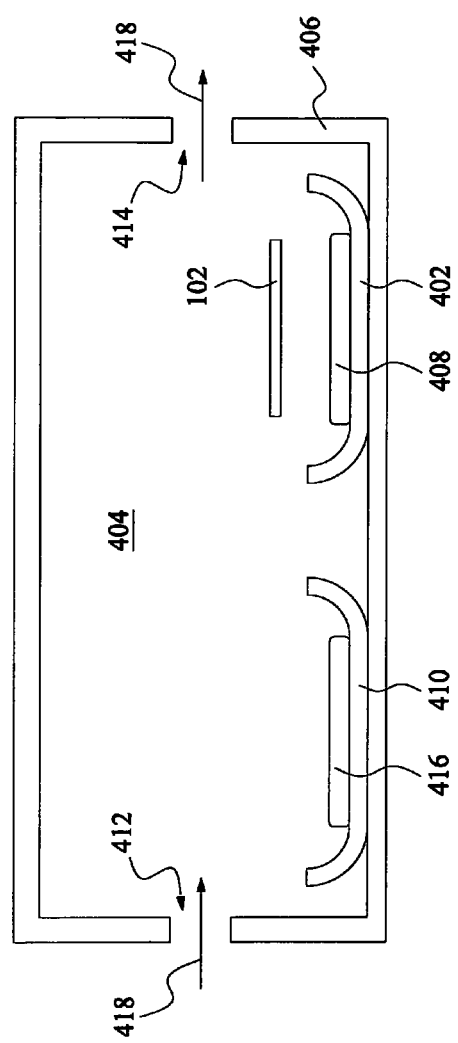
FIG. 30 is a cross-sectional view of a system for forming TMD layer(s) in accordance with some embodiments.

With reference to FIG. 30, a cross-sectional view of a system for forming TMD layer(s) is illustrated in accordance with some embodiments. In a particular embodiment using a CVD process for the formation of the dichalcogenide material (e.g. $MoS_2$) for the TMD layer 106, the CVD process may be performed as described in Ling, Xi et al., *Role of the Seeding Promoter in $MoS_2$ Growth by Chemical Vapor Deposition*, Nano Letters (2014) (hereinafter "Ling"), which reference is hereby incorporated herein by reference. In such an embodiment, the substrate 102 (comprising, e.g., $SiO_2$) may be initially treated and cleaned in order to form a hydrophilic surface. In an embodiment the substrate 102 may be cleaned and treated using a wet cleaning solution. For example, in one embodiment a piranha solution may be spread on the substrate 102 in order to clean the substrate 102 and provide a hydrophilic surface on the substrate 102. However, any suitable cleaning solution may alternatively be utilized.

Once the substrate 102 (comprising e.g., $SiO_2$) has been cleaned and a hydrophilic surface has been formed, a seeding promoter (not separately illustrated in FIG. 30) may be applied to the substrate 102 in order to assist and promote the growth of the dichalcogenide material for the TMD layer 106. In an embodiment the seeding promoter may be formed as described in Ling, and may be a material such as perylene-3,4,9,10-tetracarboxylic acid tetrapotassium salt (PTAS); crystal violate; 1, 2, 3, 4, 8, 9, 10, 11, 15, 16, 17, 18, 22, 23, 24, 25-hexadecafluoro-29H, 31H-phthalocyanine ($F_{16}CuPc$); 3,4,9,10-perylene-tetracarboxylicacid-dianhydride (PTCDA); copper phthalocyanine (CuPC); (dibenzo{[f,f']-4,4',7,7'-tetraphenyl-diindeno[1,2,3-cd:1',2',3'-lm] perylene (DBP); 4'-nitrobenzene-diazoaminoazobenzene (NAA); N,N'-bis(3-methylphenyl)-N,N'-diphenyl-9,9-spirobifluorene-2,7-diamine (spiro-TDP); Tris(4-carbazoyl-9-yl-phenyl) amine (TCTA); Bathocuproine (BCP); 1,3,5-tris(N-phenylbenzimiazole-2-yl)benzene (TPBi); 2,2',7,7'-tetra(N-phenyl-1-naphthyl-amine)-9,9'-spirobifluorene (spiro-2-NPB); iridium, tris(2-phenylpyidine) ($Ir(ppy)_3$); gold; or the like, and may be placed on the substrate 102, using, e.g., a thermal evaporation technique to a thickness of between about 0.7 Å to about 5 Å.

In a particular example for depositing the seeding promoter, 50 μM of PTAS and 100 μM of crystal violet are placed in water in order to form a solution, and the solution is then dispersed onto a cleaned surface of the substrate 102. Once the solution has been placed, a drying gas, such as nitrogen, is flowed over the solution to dry the substrate surface.

FIG. 30 illustrates that, once the seeding promoters have been placed, the substrate 102 (with the seeding promoters) may be placed over a first crucible 402 within a reaction chamber 404 surrounding by a housing 406. In an embodiment the first crucible 402 is formed from a material that won't significantly react or pollute or otherwise contaminate the substrate 102 or a first precursor material 408 (described further below) while also being able to withstand the environment from the reaction chamber 404. In an embodiment the first crucible 402 may be quartz, although any other suitable material may alternatively be utilized. The first crucible 402 may have, e.g., a depth of less than about 50 mm and a diameter of between about 10 mm and about 500 mm, although any other suitable dimensions may alternatively be utilized depending in part on the size of the substrate 102.

The first precursor material 408 may be placed within the first crucible 402. In an embodiment the first precursor material 408 comprises one of the precursors that are utilized in order to form the dichalcogenide material for the TMD layer 106. For example, in an embodiment in which the dichalcogenide material is $MoS_2$, the first precursor material 408 may be $MoO_3$ in a powder form. The substrate 102 may be placed on or over the first crucible 402 in any configuration in which the first precursor material 408 and a second precursor material 416 (discussed further below) can reach the target surface to react, such as by being offset from the first precursor material 408 using, e.g., a mounting system or hardware (not shown). In one embodiment the substrate 102 may be placed over the first crucible in a face down configuration, although any suitable configuration may alternatively be utilized. The mounting system or hardware may be affixed to the crucible 402, the housing 406, or any other suitable structure that can support the substrate 102 over the crucible 402 such that the substrate 102 is offset from the first precursor material 408.

The first crucible 402 is placed within the housing 406 of the reaction chamber 404. The housing 406 may comprise a heat resistant material, such as quartz, silicon carbide, combinations of these, or the like, and provide an interior chamber for the first crucible 402, a second crucible 410, and any heating or cooling elements that may be desired to control the internal environment of the reaction chamber 404. The external housing 406 may also provide an inlet 412 and an outlet 414 in which a non-reactive gas such as argon or nitrogen or a reactive gas such as $H_2S$ may be flowed into and out of the reaction chamber 404.

The second crucible 410 is utilized to hold a second precursor material 416 within the reaction chamber 404. In an embodiment the second crucible 410 is similar to the first crucible 402, such as being a material such as quartz, silicon carbide, combinations of these, or the like. Additionally, the second crucible 410 and, therefore, the second precursor material 416, is placed within the reaction chamber 404 upstream (relative to the eventual flow of the non-reactive gas represented in FIG. 30 by the arrows labeled 418), of the first crucible 402.

The second precursor material 416 is placed within the second crucible 410 within the reaction chamber 404. In an embodiment the second precursor material 416 is one that will react with the first precursor material 408 to form the dichalcogenide material for the TMD layer 106. For example, in the embodiment in which the first precursor material 408 and the second precursor material 416 will be used to form $MoS_2$ and the first precursor material 408 is $MoO_3$, the second precursor material 416 may be elemental sulfur in a powder form.

Once the first precursor material 408 (e.g., $MoO_3$) has been placed within the first crucible 402 and the second precursor material 416 (e.g., sulfur) has been placed within the second crucible 410, the reaction chamber 404 may be initially purged by flowing a non-reactive gas through the reaction chamber 404. In an embodiment the purging may be performed by flowing argon (with, e.g., 99.999% purity) through the reaction chamber 404 at a flow rate of about 500 sccm for about 2 minutes. Once purged, the flow of the non-reactive gas (e.g., argon) may be reduced so that the non-reactive gas may be used as a carrier gas for the reaction. In an embodiment the carrier gas may be reduced to a steady flow of about 5 sccm.

After the purging has been performed, the reaction chamber 404 may be heated using, e.g., heating elements (not separately illustrated) within the housing 406 to a suitable reaction temperature. In an embodiment in which $MoS_2$ is formed from $MoO_3$ and sulfur, the reaction chamber 404 may be heated at a rate of about 15° C./min until the reaction chamber 404 has reached a temperature of about 650° C. However, any other suitable temperatures and rates of heating, depending upon the desired material to be formed, may also be utilized.

Once at the desired reaction temperature, the second precursor material 416 (e.g., sulfur) will evaporate out of the second crucible 410 and be carried by the carrier gas (e.g., argon) to the first crucible 402, where it will react with the first precursor material 408 (e.g., $MoO_3$) at a pressure of between about 0.1 torr and about 760 torr, such as about 1 atmosphere. The reaction will form the dichalcogenide material for the TMD layer 106 (e.g., $MoS_2$) on the surface of the substrate 102. In an embodiment the dichalcogenide material may be grown for a time sufficient to form the TMD layer 106 to the first height $H_1$ of greater than about 10 nm, such as by being greater than about 50 nm or greater than about 100 nm, such as about three minutes.

Once the TMD layer 106 has been formed to the desired thickness, the reaction chamber 404 is cooled to room temperature and then purged to remove any remaining gaseous precursors. In an embodiment the purge may be performed by again flowing a non-reactive gas such as argon through the reaction chamber 404. In a particular example argon may be flowed through the reaction chamber 404 at a flow rate of about 500 sccm in order to purge the reaction chamber 404. Once purged, the substrate 102 with the TMD layer 106 may be removed from the reaction chamber 404 for further processing.

However, while the TMD layer 106 may be formed as described above, this description is intended to be illustrative and not limiting. For example, in another embodiment the TMD layer 106 (comprising, e.g., $MoS_2$) may be formed by initially forming the first precursor material 408 (in this embodiment, e.g., molybdenum) into a layer on the substrate 102 (e.g. silicon oxide) and then reacting the first precursor material 408 into the TMD layer 106, as described in Zhan, Yongjie, *Large Area Vapor Phase Growth and Characterization of $MoS_2$ Atomic Layers on SiO2 Substrate*, Small, Vol. 8, 7, pp. 966-971 (2012) (hereinafter "Zhan"), which reference is hereby incorporated by reference. In this embodiment the first precursor material 408 may be a precursor material that will be used in a later process to form the TMD layer 106. In a particular example the first precursor material 408 may be a precursor such as molybdenum (Mo) or tungsten (W), and may be deposited onto the substrate 102 using a process such as chemical vapor deposition, sputtering, or the like. Alternatively, the first precursor material 408 may comprise a non-conductive dielectric material that can provide an initial material for conversion into the TMD layer 106, such as $MoO_3$, or the like. However, any other suitable material or method of manufacture may alternatively be utilized. The first precursor material 408 may be formed directly on the substrate 102 using any suitable deposition process, such as CVD, physical vapor deposition (PVD), ALD, or the like.

Once the first precursor material 408 (e.g., Mo) is formed on the substrate 102, the substrate 102 and the first precursor material 408 may be placed on or over the first crucible 402 (without any additional first precursor material 408 being located within the first crucible 402 as in the above described embodiment). The second precursor material 416 (e.g., sulfur for a sulfurization process or selenium for a selenization process) may be placed within the second crucible 410, and both the first crucible 402 and the second crucible 410 may be placed within the housing 406 of the reaction chamber 404, with the second crucible 410 upstream from the first crucible 402.

Once in place inside the reaction chamber 404, the reaction chamber 404 may be initially purged in order to remove any undesired impurities from the reaction chamber 404. In an embodiment the purge may be performed by flowing nitrogen ($N_2$) through the reaction chamber at a flow rate of between about 150 sccm and about 200 sccm for about 15 minutes. However, any suitable method of purging may alternatively be utilized.

After the reaction chamber 404 has been purged, the temperature of the reaction chamber 404 is increased to a desired reaction temperature. In a particular embodiment in which $MoS_2$ is formed from molybdenum and sulfur, the temperature is increased in stages, with an initial rate of temperature increase increases the reaction chamber 404 from room temperature to about 500° C. in about 30 minutes. Next, the temperature is increased to the desired reaction temperature of between about 500° C. and about 1000° C., such as about 750° C. in about 90 minutes. However, any suitable temperatures or other processes conditions that will react the second precursor material 416 (e.g., sulfur) with the first precursor material 408 (e.g., Mo) may alternatively be utilized, and all such temperature and process conditions are fully intended to be included within the embodiments.

Once the desired reaction temperature has been reached, the temperature of the reaction chamber 404 is maintained in order to react the second precursor material 416 (e.g., sulfur which has turned into a vapor and been transported from the second crucible 410 to the first crucible 402) with the first precursor material 408 (e.g., molybdenum) and form the TMD layer 106 from the first precursor material 408 on the substrate 102. The reaction may be continued to react the first precursor material 408 with the second precursor material 416 and to fully transform the first precursor material 408 into the TMD layer 106.

However, the processes as described above are intended to be illustrative only and are not intended to be limiting upon the embodiments. Rather, any suitable process of forming or placing the TMD layer 106 onto the substrate 102 may alternatively be utilized. For example, a CVD process using precursors such as $MoO_3$ and $H_2S$, or precursors such as Mo and $H_2S$, may also be utilized. Alternatively, a physical vapor deposition PVD process which utilizes a $MoS_2$ target may be utilized. Additionally, any other suitable processes, such as dissociation of spin-on coated $(NH_4)_2MoS_4$, or growing the TMD material on a substrate such as copper, nickel, or sapphire and then transferring the TMD material to the substrate 102, may be used.

In yet another embodiment, the TMD material for the TMD layer 106 may be formed in bulk separately from the substrate 102 and then a layer of the bulk TMD material is removed and placed onto the substrate 102. For example, a mechanical exfoliation using, e.g., a Scotch-type tape may be utilized to remove a layer or layers of TMD materials from a bulk TMD material and then the TMD material may be transferred to the substrate 102 to form the TMD layer 106. Alternatively, a liquid exfoliation of the TMD materials from the bulk TMD material using, e.g., an intercalation such as n-butyl lithium dissolved in hexane may be utilized to remove the TMD layer 106 for transport to the substrate 102. Any suitable method of forming or placing the TMD layer 106 may be used, and all such methods are fully intended to be included within the scope of the embodiments.

Although six TMD sublayers are illustrated in FIG. 5, in another embodiment, the number of TMD sublayers of the TMD layer 106 in each of the regions may be more or less than six sublayers, such as more than two (e.g. one, two, three, four, five, seven, eight, nine, ten, or more than ten TMD sublayers).

Figure 6:
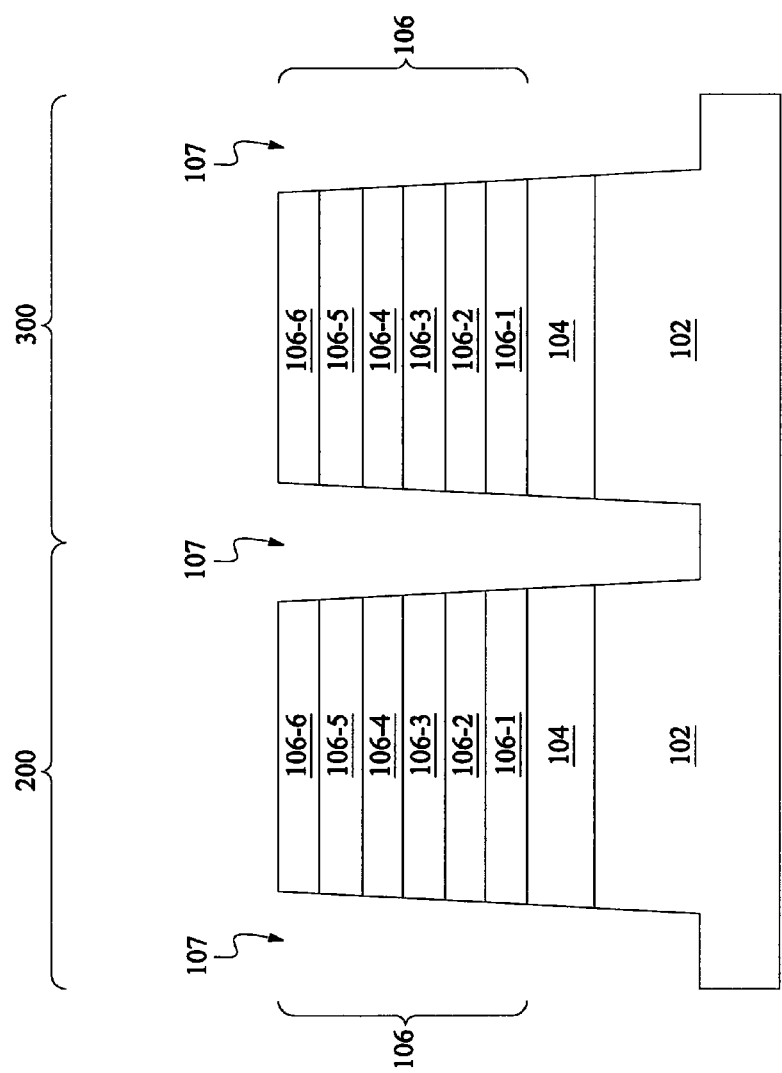

FIG. 6 illustrates the formation of trenches 107 through the TMD layer 106, the insulator layer 104, and partially into the substrate 102. The trenches 107 form the first region 200 and the second region 300 and isolate the first region 200 from the second region 300. In some embodiments, the trenches 107 may be formed by etching trenches in the TMD layer 106, the insulator layer 104, and the substrate 102. The etching may be any acceptable etch process, such as a reactive ion etch (RIE), neutral beam etch (NBE), the like, or a combination thereof. The etch may be anisotropic.

Figure 7:
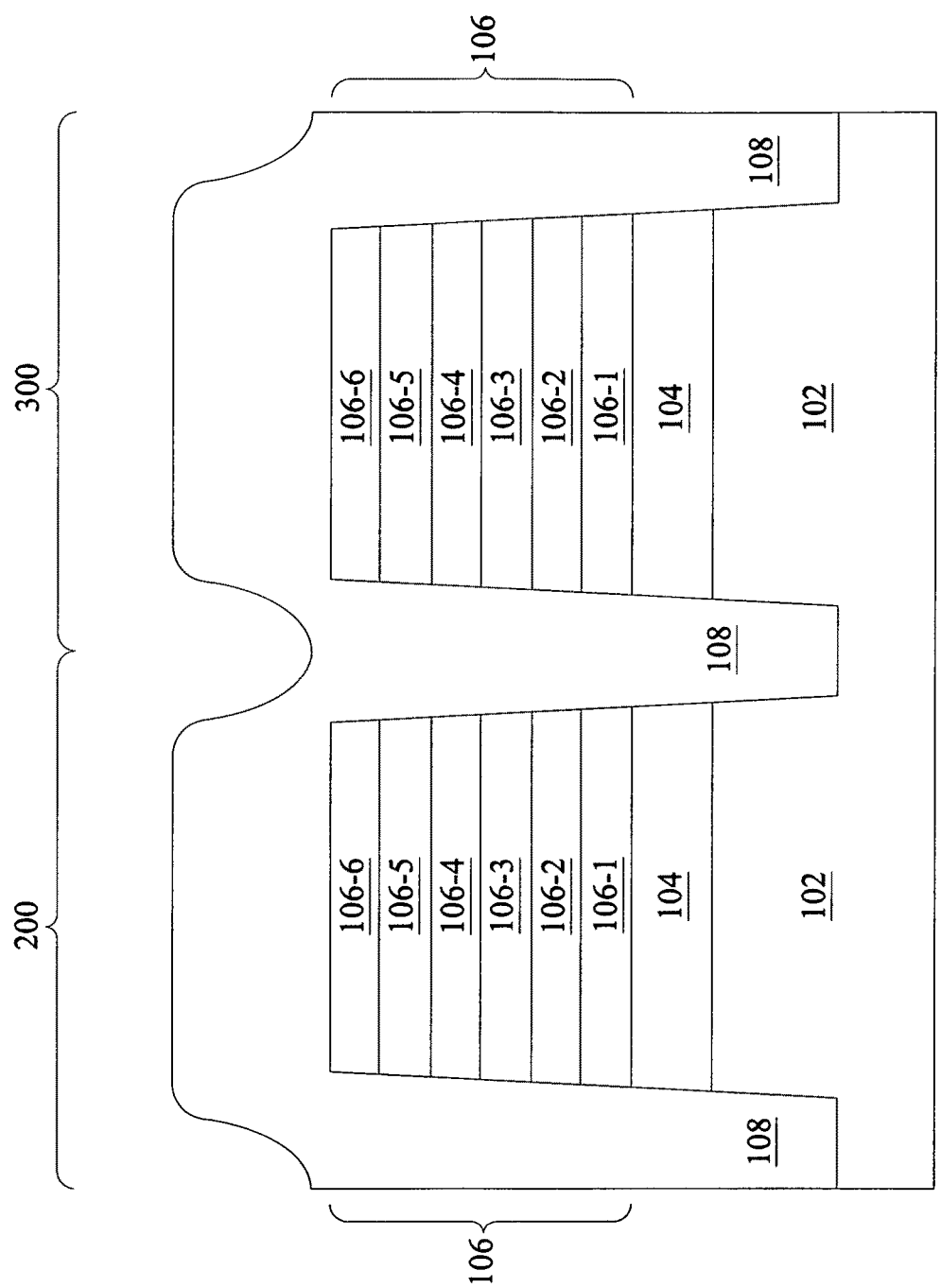

In FIG. 7, an insulation material 108 is formed in the trenches 107 to form the isolation regions 108. The insulation material 108 may be an oxide, such as silicon oxide, a nitride, the like, or a combination thereof. In some embodiments, the insulation material 54 may be formed by a HDP-CVD, FCVD, the like, or a combination thereof. Other insulation materials formed by any acceptable process may be used. In the illustrated embodiment, the insulation material 108 is silicon oxide formed by the FCVD. An anneal process may be performed once the insulation material is formed. The insulating material 108 may be referred to as isolation regions 108.

Figure 8:
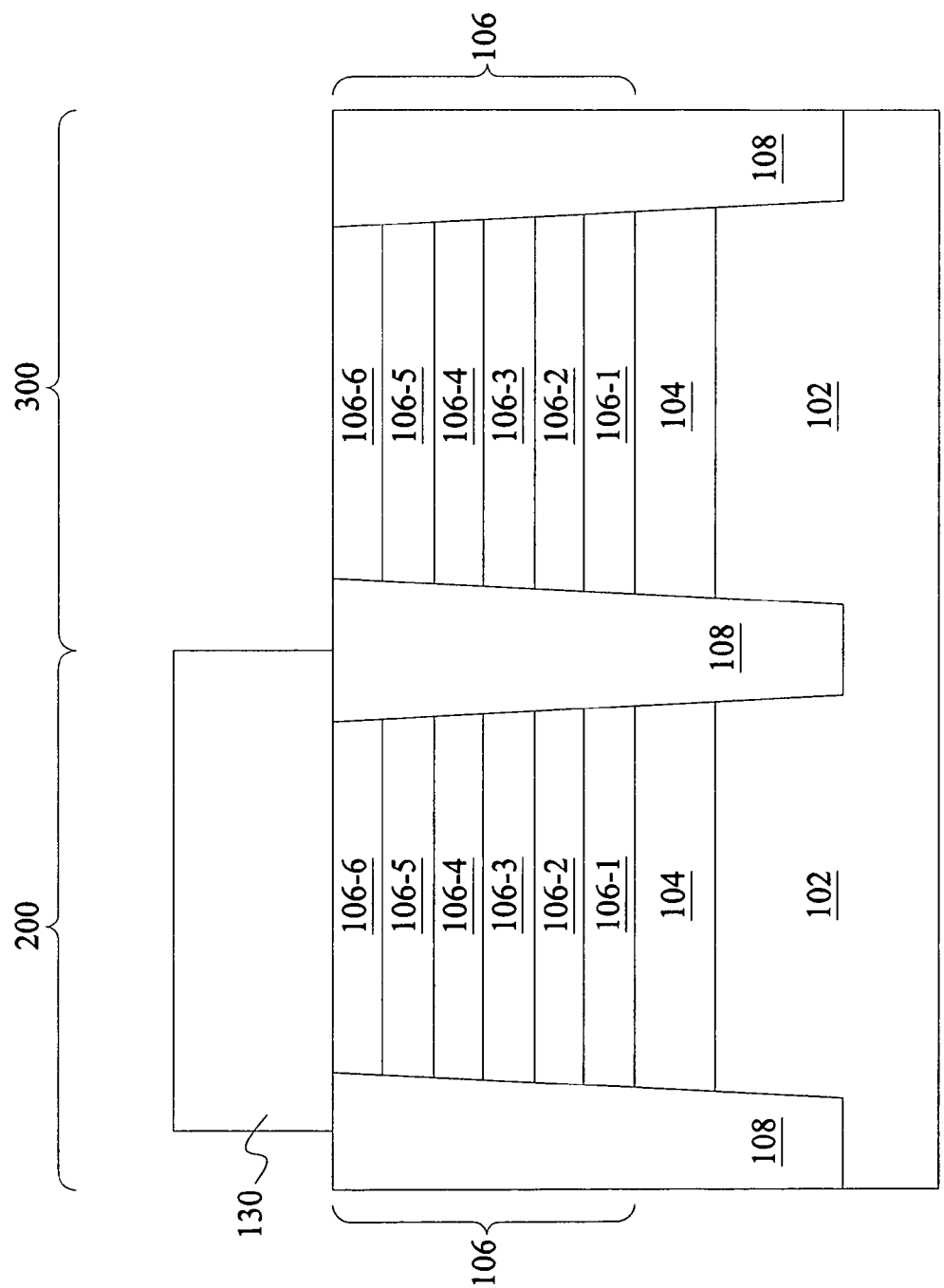

In FIG. 8, a planarization process, such as a CMP, may remove any excess insulation material 108 over the top surfaces of the TMD layers 106. The isolation regions 108 isolate the first region 200 and the second region 300 from each other and also the isolation regions 108 protect the edges (i.e. sidewalls) of the TMD sublayers so that a subsequent etching process can be a sublayer-by-sublayer process starting from the top surface of the topmost TMD sublayer.

In some embodiments, the CMP process forms top surfaces of the isolation regions 108 and top surfaces of the TMD layers 106 that are coplanar. In some embodiments, the isolation regions 108 may be removed faster or slower than the TMD layers 106 such that, after the CMP process, the top surface of the isolation regions 108 may be slightly higher or slightly lower than the top surfaces of the TMD layers 106. In the embodiment where the top surfaces of the isolation regions 108 are slightly lower than the top surface of the TMD layer 106, some portion of the edge(s) (i.e. sidewall(s)) of the TMD layers 106 may be exposed. In this embodiment, the TMD sublayers that have edges exposed can be removed by an etch process to ensure that the top surfaces of the TMD layers 106 and the isolation regions 108 are coplanar or that the top surfaces of the isolation regions 108 are slightly higher than the top surfaces of the TMD layers 106 to protect the edges of the TMD layers 106. In some embodiments, the etch process can be a wet etch process or a dry etch process. In an embodiment, the etchant includes $XeF_2$ or the like, to remove the TMD sublayer(s) with their edges exposed. By ensuring that the edges of the TMD sublayer(s) are protected by the isolation regions 108, the sublayer-by-sublayer process removal as described below in reference to FIGS. 11B, 11C, and 11D is achievable.

This two-step planarization process described above (e.g., CMP+$XeF_2$) is a self-limiting (sometimes referred to as self-aligning) planarization process as only the TMD layers 106 with exposed edges will be removed and the sublayer-by-sublayer process will stop when the top surfaces of the TMD layers 106 are at or below the top surfaces of the isolation regions 108.

A single-crystal TMD layer has a chemically inactive van der Waals top surface. This top surface is mostly inert and little chemical reaction affects it. However, the edges of the TMD layer are much more chemically active, in comparison to the top surface, due to the incomplete termination of chemical bonds at the edges. Thus the edges of the TMD layer need to be protected during an etch process so that the removal of the TMD layer can be a controlled etch sublayer-by-sublayer starting from the top surface. As illustrated in FIG. 8, the edges of the TMD layer 106 are protected by isolation regions 108 and the top surface is exposed for the subsequent sublayer-by-sublayer etch process.

Further, in FIG. 8, a mask layer 130 may be formed over the TMD layer 106 of the first region 200. The mask layer 130 may be formed of a polymer, such as polymethylmethacrylate (PMMA), or other suitable mask materials, such as silicon nitride, a photoresist, or the like. The mask layer may be formed by a spin coating process, CVD, ALD, sputtering, the like, or a combination thereof.

Figure 9:
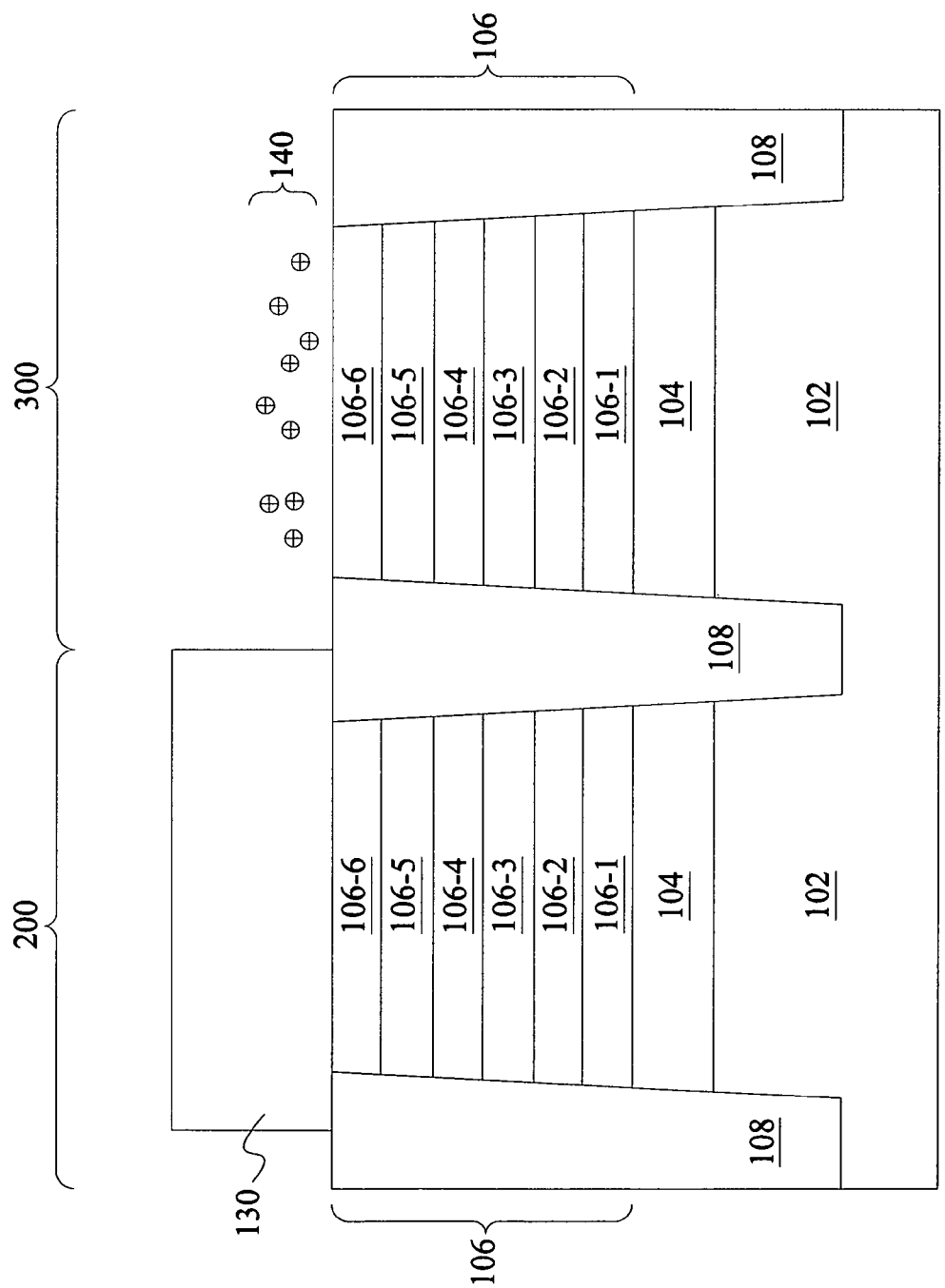
Figure 10:
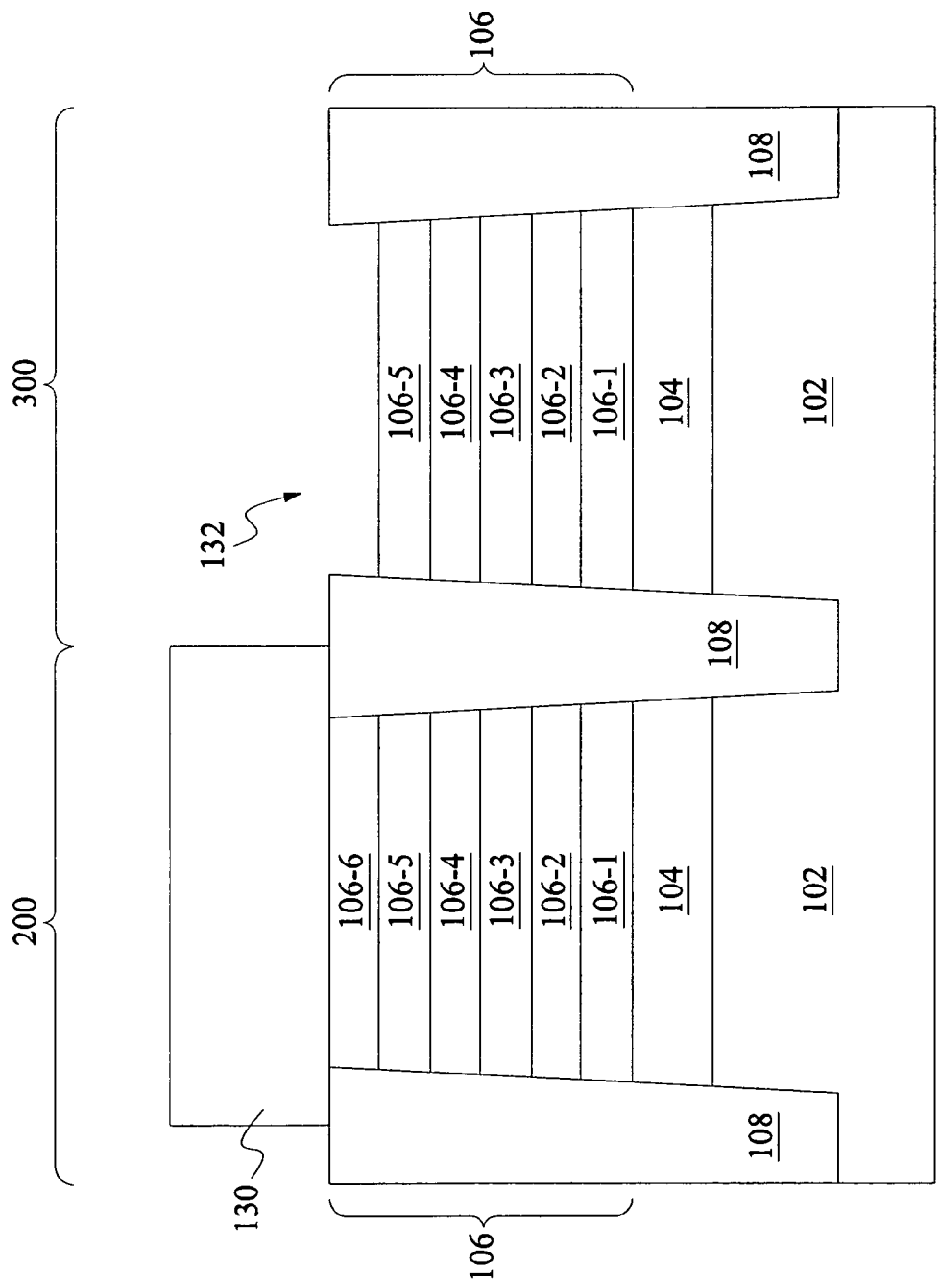

FIGS. 9 and 10 illustrate a removal process 140 to remove a single TMD sublayer (e.g. TMD sublayer 106-6 in second region 300). FIG. 9 illustrates the removal process 140 reacting with the topmost TMD sublayer 106-6 in the second region 300. In an embodiment, the surface of the exposed TMD sublayer 106-6 is treated by plasma and defects, such as point defects, are generated in the TMD sublayer 106-6. In some embodiments, the defect of the topmost TMD sublayer (e.g. TMD sublayer 106-6 in second region 300 of FIG. 8) can be generated by an Ar+ plasma treatment with zero volts of DC bias. The one or more defects generated are weak spots with one or more imperfections in the crystalline structure of the topmost TMD sublayer. After the one or more defects of the topmost TMD sublayer is generated, the topmost TMD sublayer can be removed by an etch process, starting from the weak spots with the crystalline imperfections. In some embodiments, the etch process can be a wet etch process or a dry etch process. In an embodiment, the etchant includes $XeF_2$ or the like, to remove the defected topmost TMD sublayer (e.g. TMD sublayer 106-6 in second region 300). Since only the defect is generated at the topmost TMD sublayer, the process will stop on the top surface of the next underlying TMD sublayer (e.g. TMD sublayer 106-5 in second region 300), as illustrated in FIG. 10. Sublayer-by-sublayer removal is thus achieved by this process.

Figure 11A:
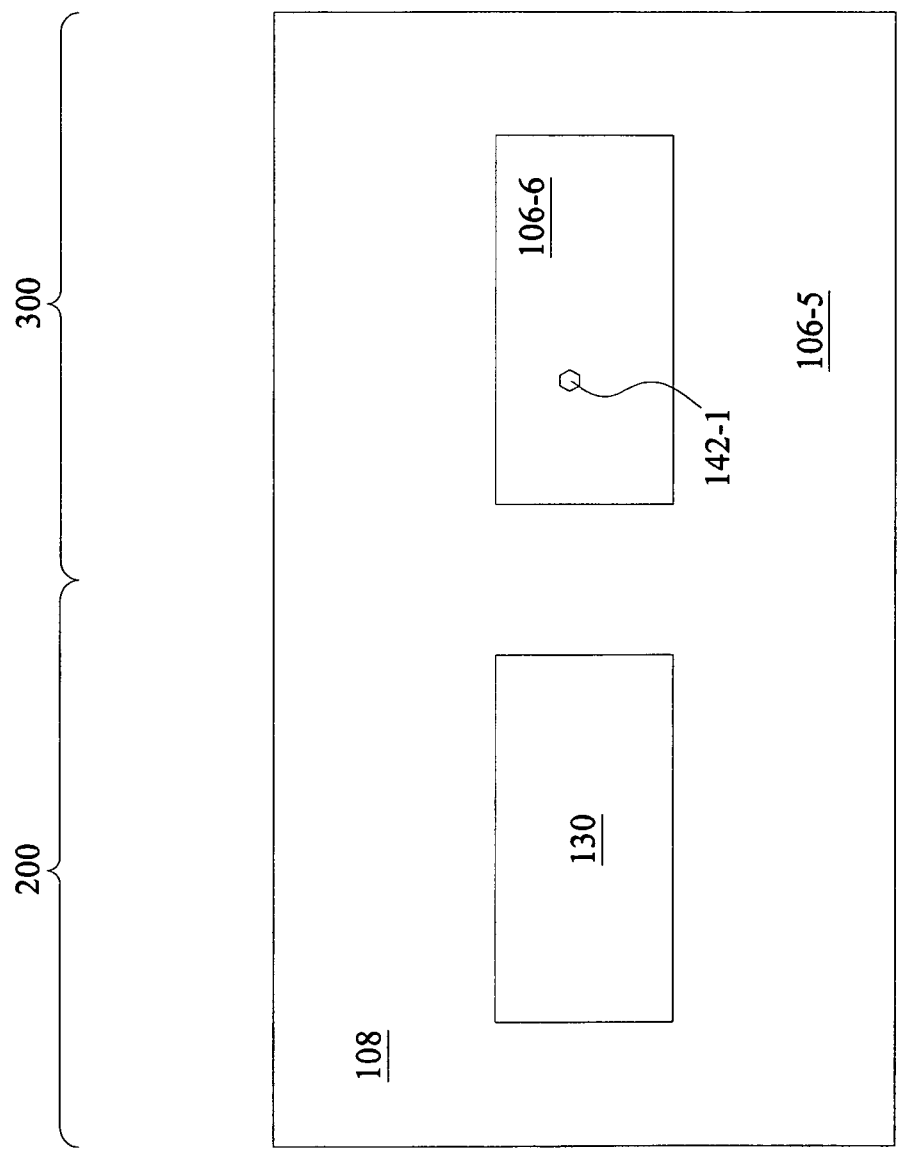
FIGS. 11A through 11D are top views of intermediate steps during a process to remove a single TMD layer.
Figure 11B:
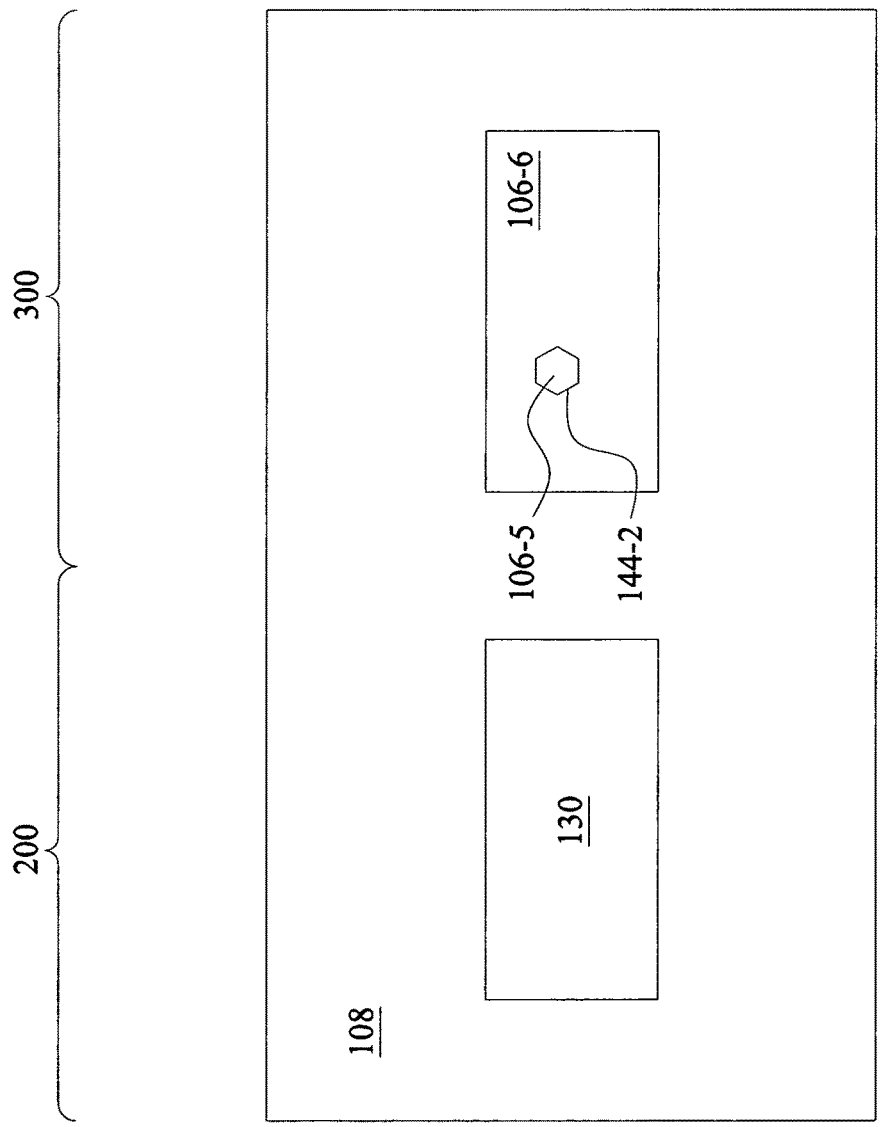
Figure 11C:
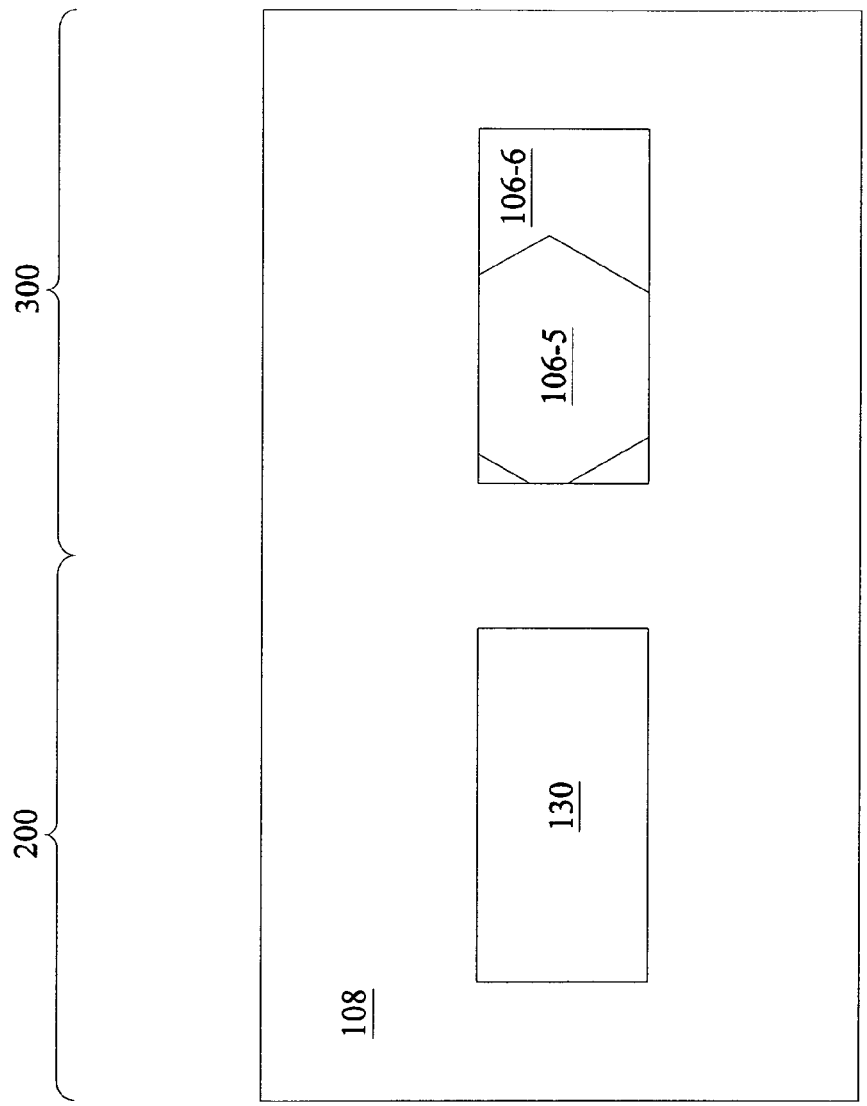
Figure 11D:
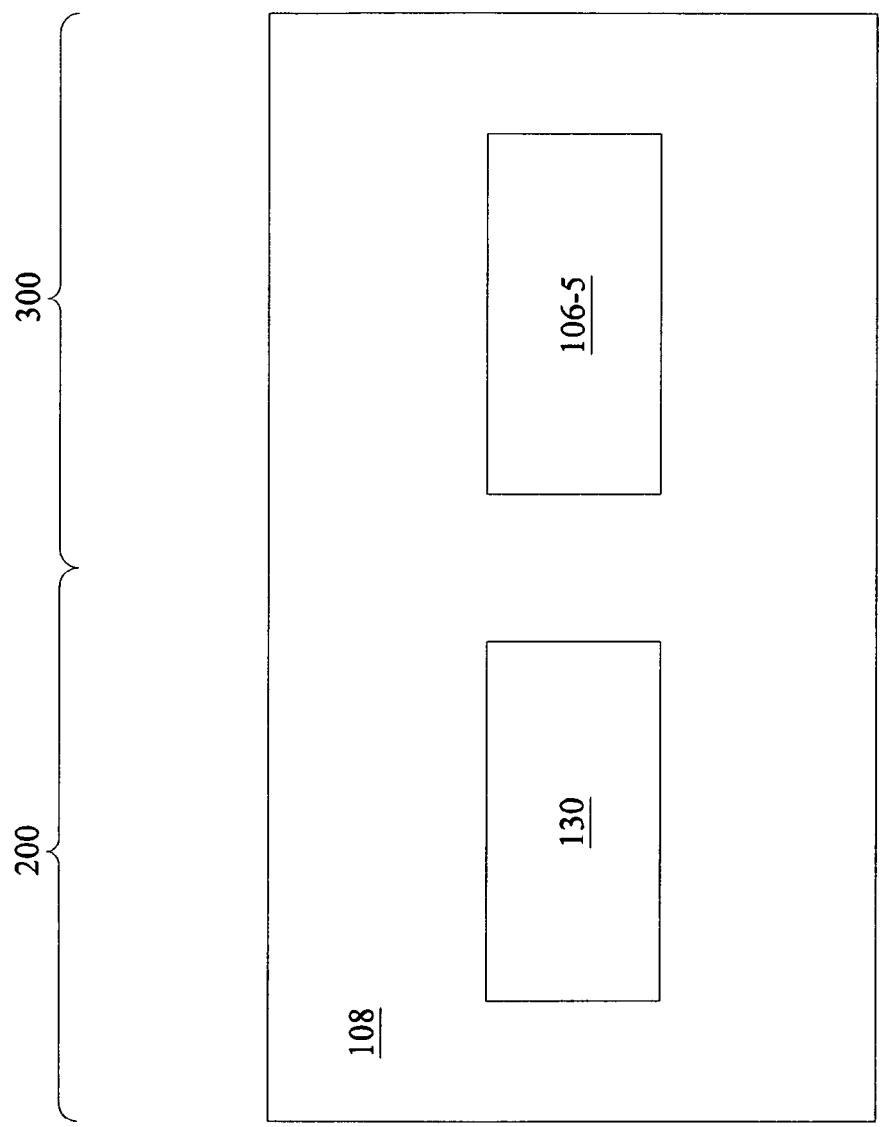

FIGS. 11A through 11D are top views of intermediate steps during a process to remove a single TMD sublayer. FIG. 11A illustrates a top-view of an intermediate step at a similar timeframe as that illustrated in the cross-sectional view of FIG. 9. In FIG. 11A, at least one defect 142-1 has been formed in the TMD sublayer 106-6 in the second region 300. As discussed above, the defect 142-1 (sometimes referred to as a point defect 142-1) can be formed by a plasma treatment including an Ar+ plasma treatment with zero volts of DC bias. In an embodiment where the TMD sublayer 106-6 includes $MoS_2$, the point defect 142-1 starts to form when the Ar+ plasma removes at least one S atom on the top layer of S atoms (see FIG. 2). After the removal of the at least one S atom, the Ar+ plasma can be stopped. The removal of the at least one S atom exposes three Mo atoms with dangling bonds.

Next, as illustrated in FIGS. 11B, 11C, and 11D, an etch process including, for example, $XeF_2$ as an etchant is performed. At first, the etch process exposes the three exposed Mo atoms to $XeF_2$. The etch process can first remove the three exposed Mo atoms and one S atom at the bottom (see FIG. 2) to form a hexagonal opening 144-2 from the point defect 142-1. As illustrated, the next TMD sublayer 106-5 is exposed in the hexagonal opening 144-2. FIG. 11C illustrates the continued growth of the hexagonal opening 144-2 as the etching process continues laterally until the TMD sublayer 106-6 is removed as illustrated in FIG. 11D.

Figure 12:
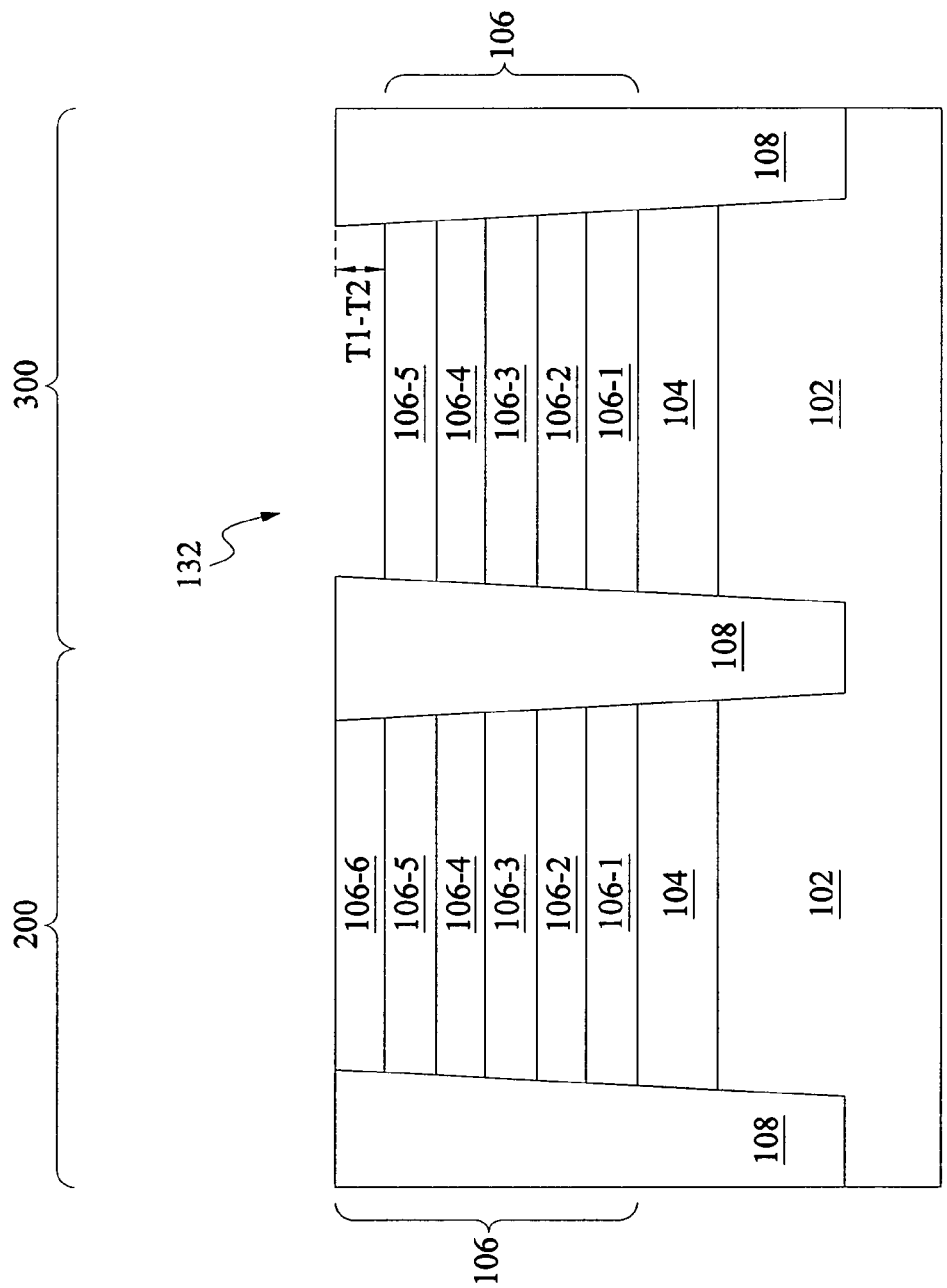

FIG. 12 illustrates the structure after the removal of the TMD sublayer 106-6 in the second region 300 and the removal of the mask layer 130 from the first region 200. The mask layer 130 may be removed by a suitable process, such as an etch process or an ashing process. The removal of the TMD sublayer 106-6 from the second region 300 forms a recess 132 with a first depth. In some embodiments, the first depth of the trench 132 is defined as the difference between the desired thicknesses (see T1 and T2 in FIG. 1A, 13, and 15) of the TMD channels in the first region 200 and the second region 300. In an embodiment, the first depth T1-T2 is from about 0.65 nm to about 6.5 nm.

Figure 13:
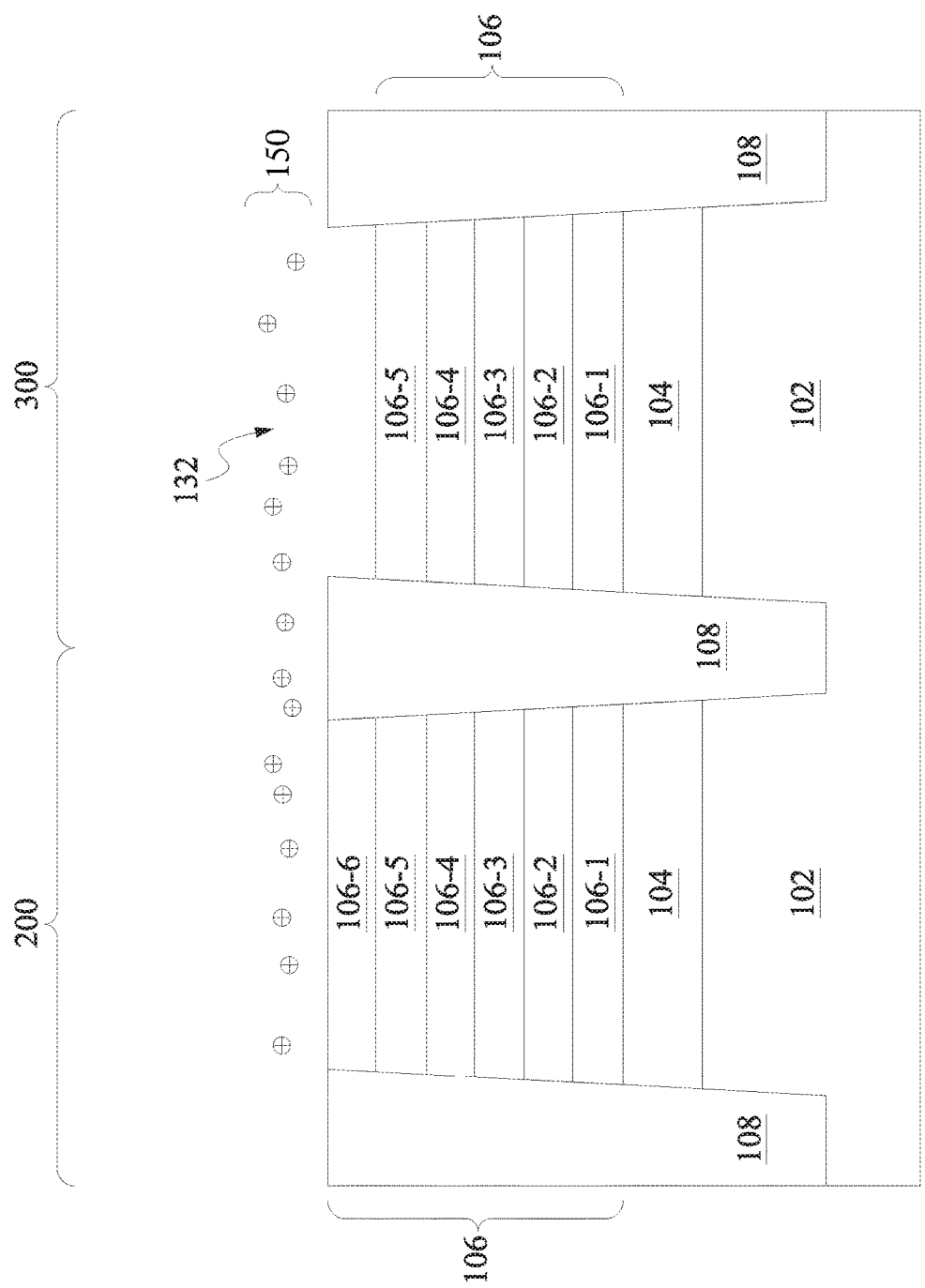

FIG. 13 illustrates a removal process 150 to remove a single TMD sublayer from both the first region 200 and the second region 300 (e.g. TMD sublayer 106-6 in the first region 200 and TMD sublayer 106-5 in the second region 300). The removal process 150 can be the similar sublayerby-sublayer process described above in FIGS. 9, 10, and 11A-11D and the descriptions are not repeated herein.

Figure 14:
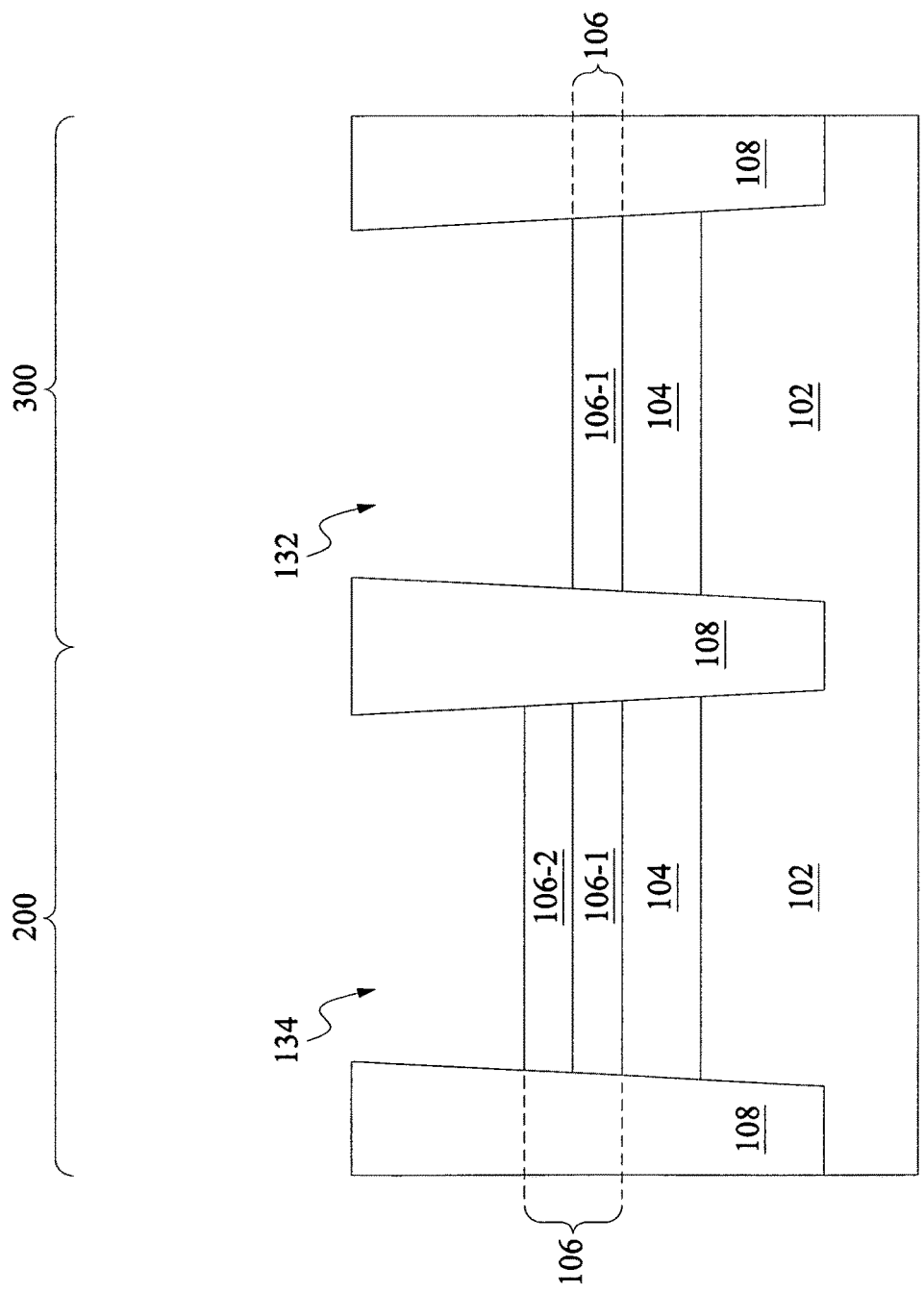

FIG. 14 illustrates the structure after the removal process 150 continues to remove the TMD sublayers in both the first region 200 and the second region 300 until there are a desired number of TMD sublayers in each of the regions to form the desired thicknesses T1 and T2 for the first region 200 and the second region 300, respectively. In the illustrated embodiment, there are two TMD sublayers 106-1 and 106-2 in the first region and one sublayer 106-1 in the second region 300. The removal process forms recess 134 in the first region between the isolation regions 108 and recess 132 in the second region 300 between the isolation regions 108.

Figure 15:
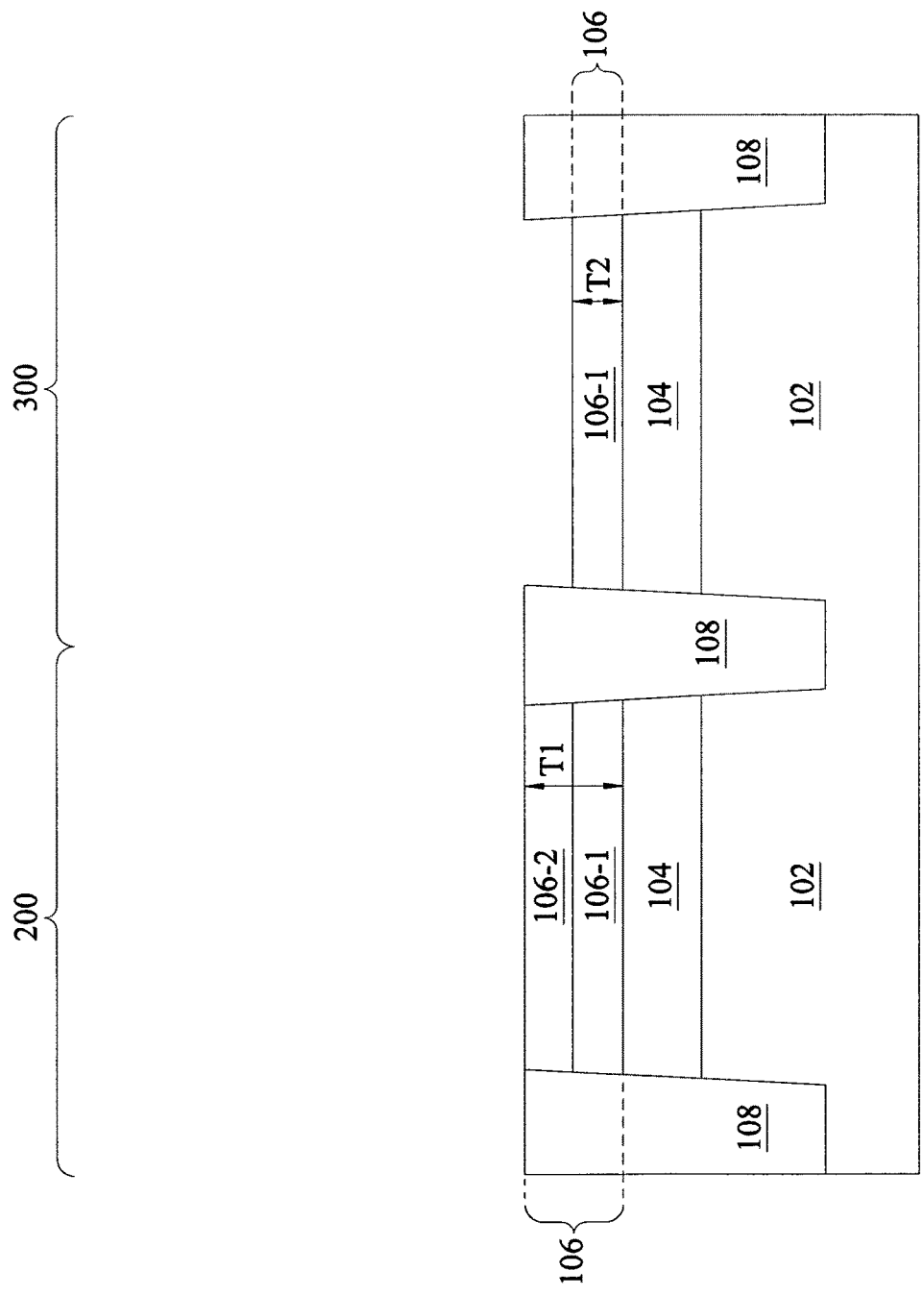

In FIG. 15, the isolation regions 108 are recessed. In some embodiments, the isolation regions 108 can be recessed by an etch process, and in some embodiments, by a planarization process, such as a CMP, to remove any excess isolation regions 108 material and form top surfaces for the isolation regions 108 that are coplanar with the highest TMD sublayer (see TMD sublayer 106-2 in FIG. 15).

Figure 16:
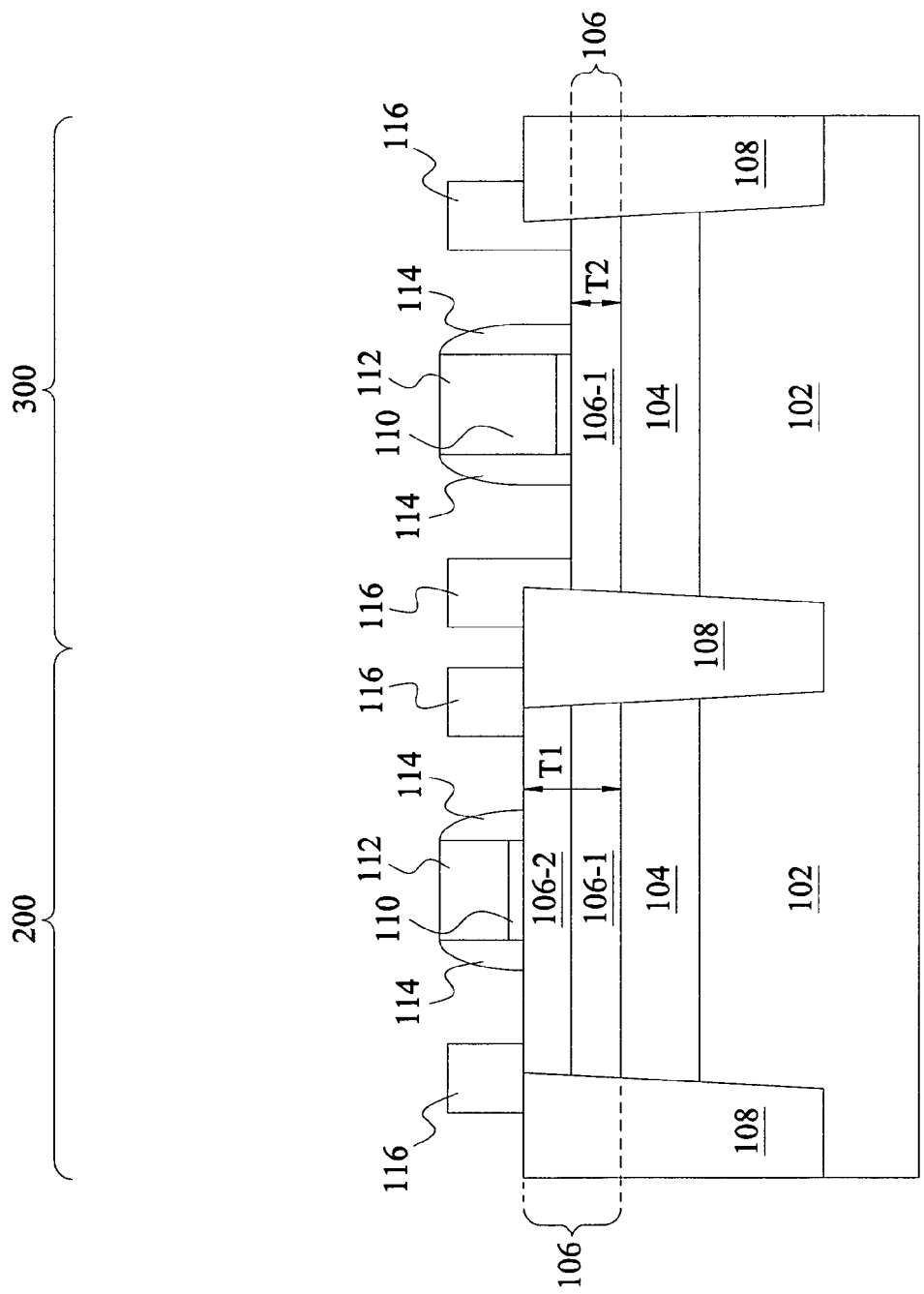

FIG. 16 illustrates the structure after the formation of gate stacks, gate spacers 114, and contacts 116. Gate stacks are formed over the TMD layers 106 in the first region 200 and the second region 300. The gate stacks include gate dielectrics 110 and gate electrodes 112. The gate dielectrics 110 may include silicon oxide, silicon nitride, or multilayers thereof. In some embodiments, gate dielectric 110 include a high-k dielectric material, and in these embodiments, gate dielectrics 110 may have a k value greater than about 7.0, and may include a metal oxide or a silicate of Hf, Al, Zr, La, Mg, Ba, Ti, Pb, and combinations thereof. The formation methods of gate dielectrics may include MBD, ALD, PECVD, and the like.

Gate electrodes 112 are deposited over gate dielectrics 110 in the first region 200 and the second region 300. The gate electrodes 112 may include polysilicon or the like. In some embodiments, the gate electrodes 112 may be made of a metal-containing material such as TiN, TaN, TaC, Co, Ru, Al, combinations thereof, or multi-layers thereof. The gate electrodes may be formed by PVD, sputtering, CVD, the like, or a combination thereof. A gate patterning step may be performed to pattern both the gate electrodes 112 and the gate dielectrics 110 to form the gate stacks.

After the formation of the gate stacks, gate spacers 114 are formed on sidewalls of the gate electrodes 112 and gate dielectrics 110. In an embodiment, the formation of the gate spacers 114 starts when a spacer layer is conformally deposited over the isolation regions 108, TMD layers 106, and along top surfaces and sidewalls of the gate stacks such that the thickness of the spacer layer is substantially a same thickness throughout the layer. In some embodiments, the spacer layer is made of SiN, SiON, SiC, SiCN, SiOCN, the like, or a combination thereof. The spacer layer may be deposited using an appropriate deposition process, such as ALD, CVD, PVD, the like, or a combination thereof. The spacer layer is then anisotropically etched, such as by using a plasma etching like an RIE or the like, to remove substantially horizontal portions of the conformal spacer layer. The remaining vertical portions of the conformal spacer layer form the gate spacers 114 along the sidewalls of the gate stacks.

The contacts 116 are formed have at least a portion in contact with the topmost TMD sublayer in each of the first region 200 and the second region 300. For example, each of the first and second regions 200 and 300 may include a source contact 116 and a drain contact 116 formed over the topmost TMD sublayer (106-2 in first region 200 and 106-1 in second region 300). The source contact 116 and the drain contact 116 for each of the regions may be laterally separated from each other, as shown in FIG. 15. The source contact 116 and the drain contact 116 may include copper, aluminum, palladium, silver, nickel, gold, titanium, gadolinium, alloys thereof, or the like.

In some embodiments, the structures of each of the first region 200 and the second region 300 may be a transistor (e.g. a field effect transistor) having a 2-D material structure (e.g. the TMD layer 106. In operation, a channel may be formed in the TMD layer 106, e.g. in response to voltages supplied to or applied by gate electrode 112 such that current may flow between the source contact 116 and the drain contact 116. As an example, the channel may be formed in a portion of the TMD layer 106 below the gate stack 112 and 110 and between the source contact 116 and the drain contact 116.

Figure 17:
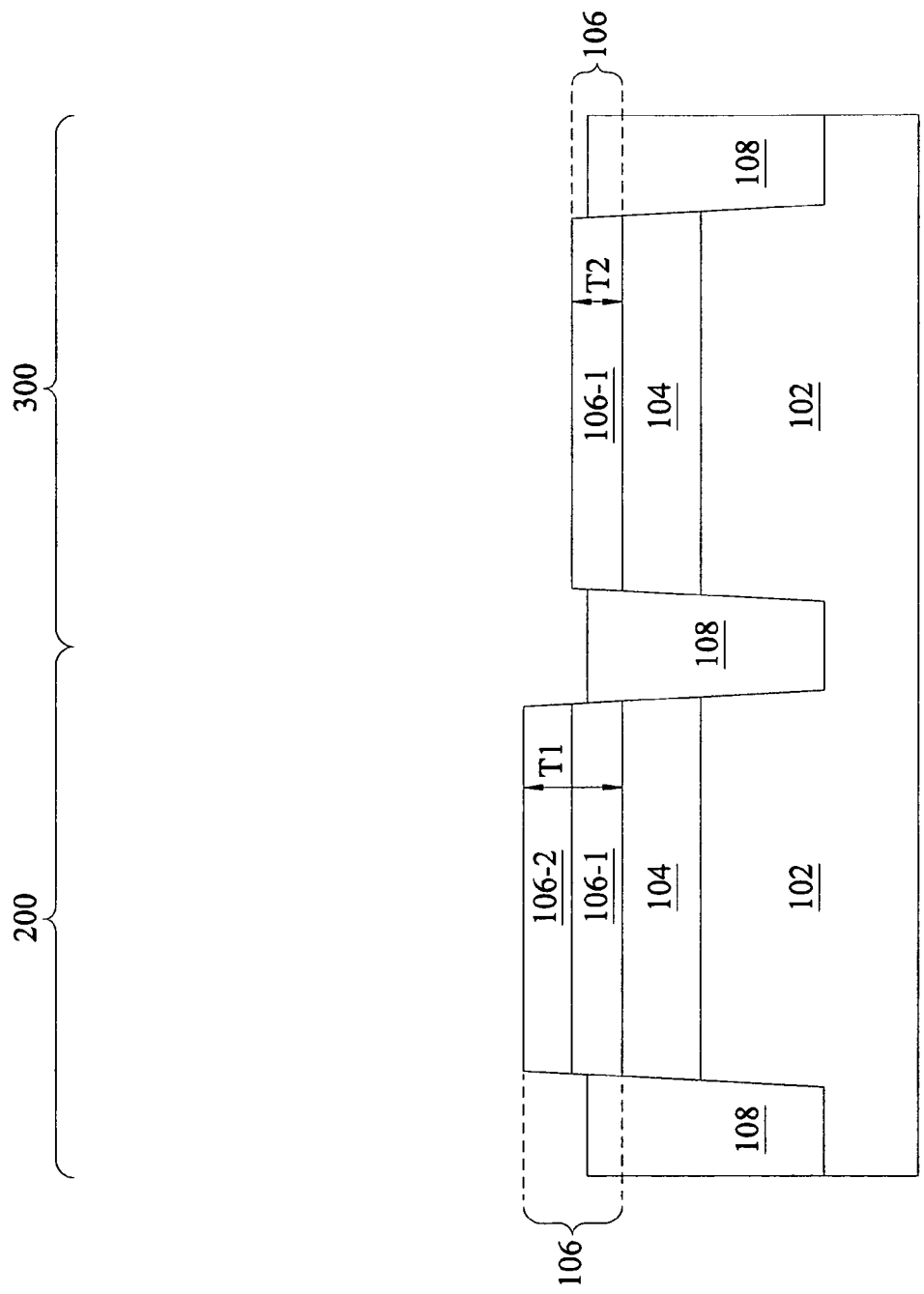
FIGS. 17 and 18 are cross-sectional views of intermediate steps during a process for forming a device structure in accordance with some embodiments.
Figure 18:
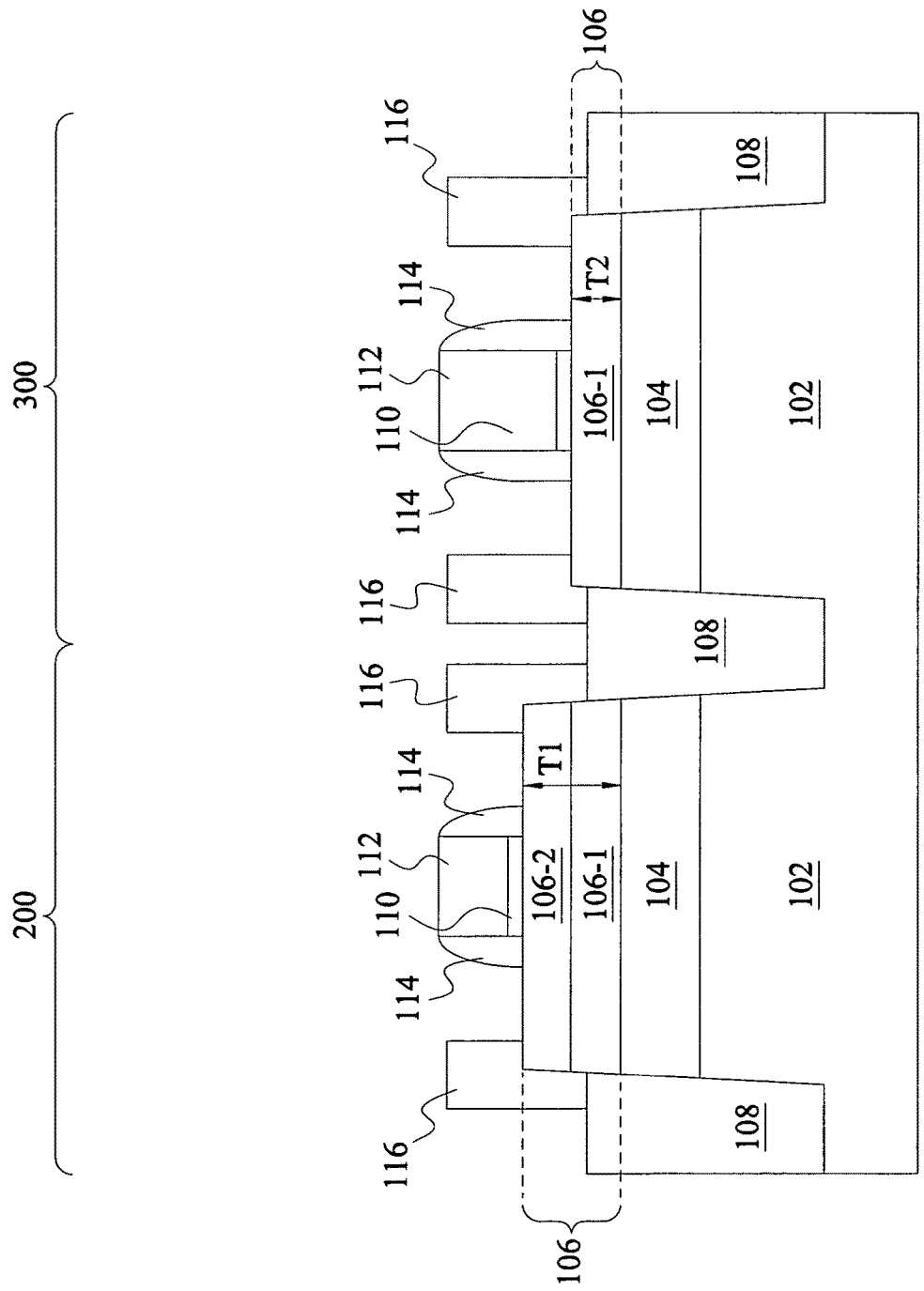

FIGS. 17 and 18 are cross-sectional views of intermediate steps during a process for forming a device structure in accordance with some embodiments. This embodiment is similar to the previously described embodiments except that the isolation regions 108 are further recessed below the top surface of the highest TMD sublayer (see TMD sublayer 106-2 in FIG. 17). Details regarding this embodiment that are similar to those for the previously described embodiment will not be repeated herein.

FIG. 17 illustrates an intermediate step similar to that of FIG. 15 described above. In this embodiment, the isolation regions 108 are further recessed to have top surfaces below the top surface of the highest TMD sublayer (see TMD sublayer 106-2 in FIG. 17). The isolation regions can be etched by any suitable etch process that is selective to the isolation regions and will not etch the TMD layers 106.

FIG. 18 illustrates the structure after the formation of gate stacks, gate spacers 114, and contacts 116. The formation and materials of these structures are similar to that described above in FIG. 16 and FIG. 1A and the descriptions are not repeated herein. In this embodiment, the contacts 116 physically contact both the top surface and the exposed sidewalls of the TMD layers 106 due to the further recessing of the isolation regions 108. The conductivity of the contacts 116 at the sidewall/edge of the TMD layer 106 is higher than that at the top surface of the TMD layer 106, and thus, the exposed edges may further enhance the on-state current of the transistors in the first region 200 and the second region 300.

FIGS. 19 through 28 are cross-sectional views of intermediate steps during a process for forming a device structure in accordance with some embodiments. This embodiment is similar to the previously described embodiment except that separate removal processes are performed on the TMD layers 106 in the first region 200 and the second region 300 as opposed to a shared removal process in the previous embodiment (see FIG. 13). Details regarding this embodiment that are similar to those for the previously described embodiment will not be repeated herein.

Figure 19:
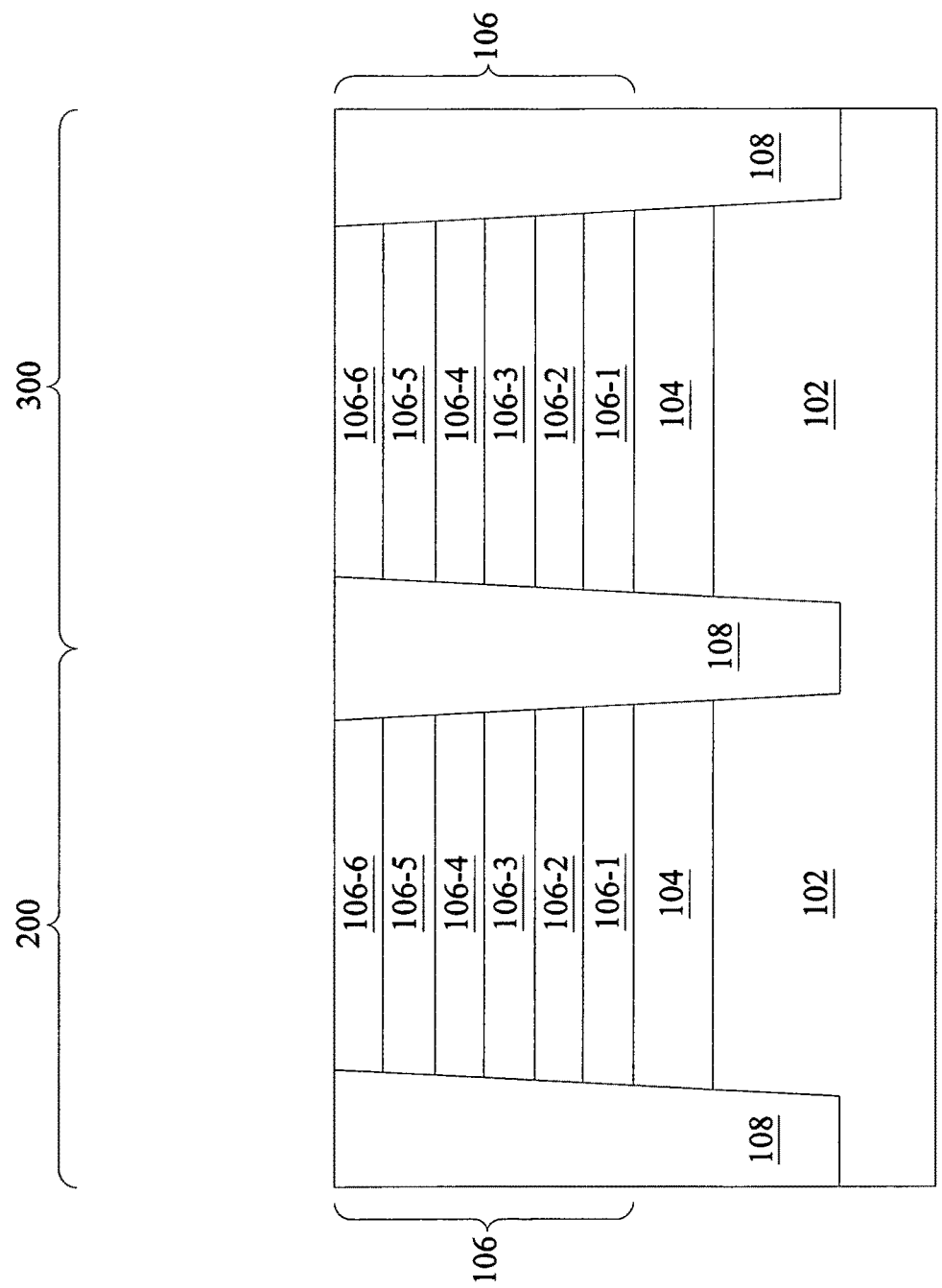
FIGS. 19 through 28 are cross-sectional views of intermediate steps during a process for forming a device structure in accordance with some embodiments.
Figure 20:
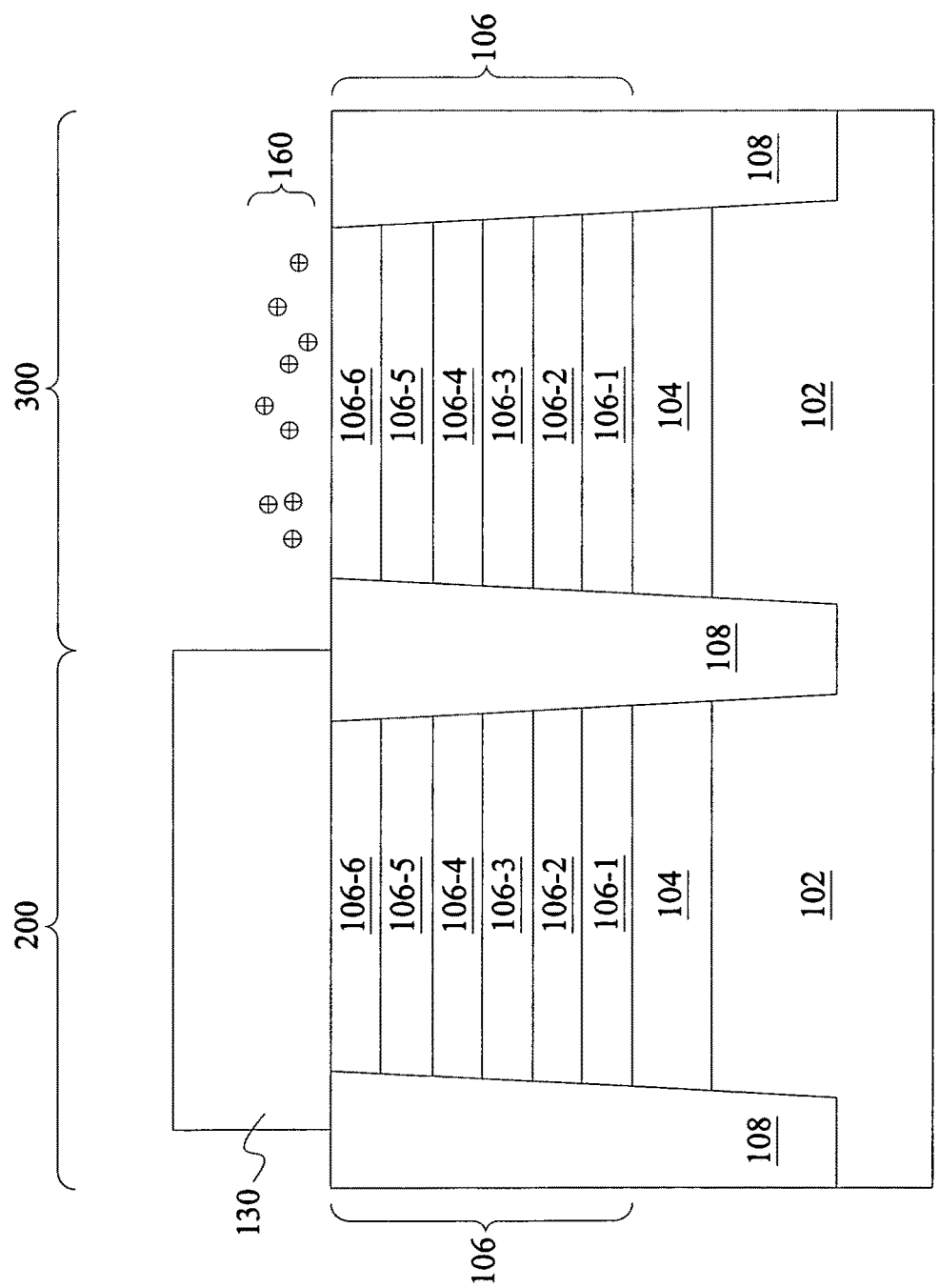

FIG. 19 illustrates an intermediate step similar to that after FIG. 7 described above wherein the isolation regions 108 have been recessed to top surfaces of the TMD layers 106. FIG. 20 illustrates the formation of the mask layer 130 over the first region and a removal process 160 reacting with the TMD layer 106 in the second region 300. The mask layer 130 is similar to the mask layer described above in FIG. 8 and the description is not repeated herein. The removal process 160 is similar to the removal process 140 described above in FIGS. 9, 10, and 11A-11D, and the description is not repeated herein.

Figure 21:
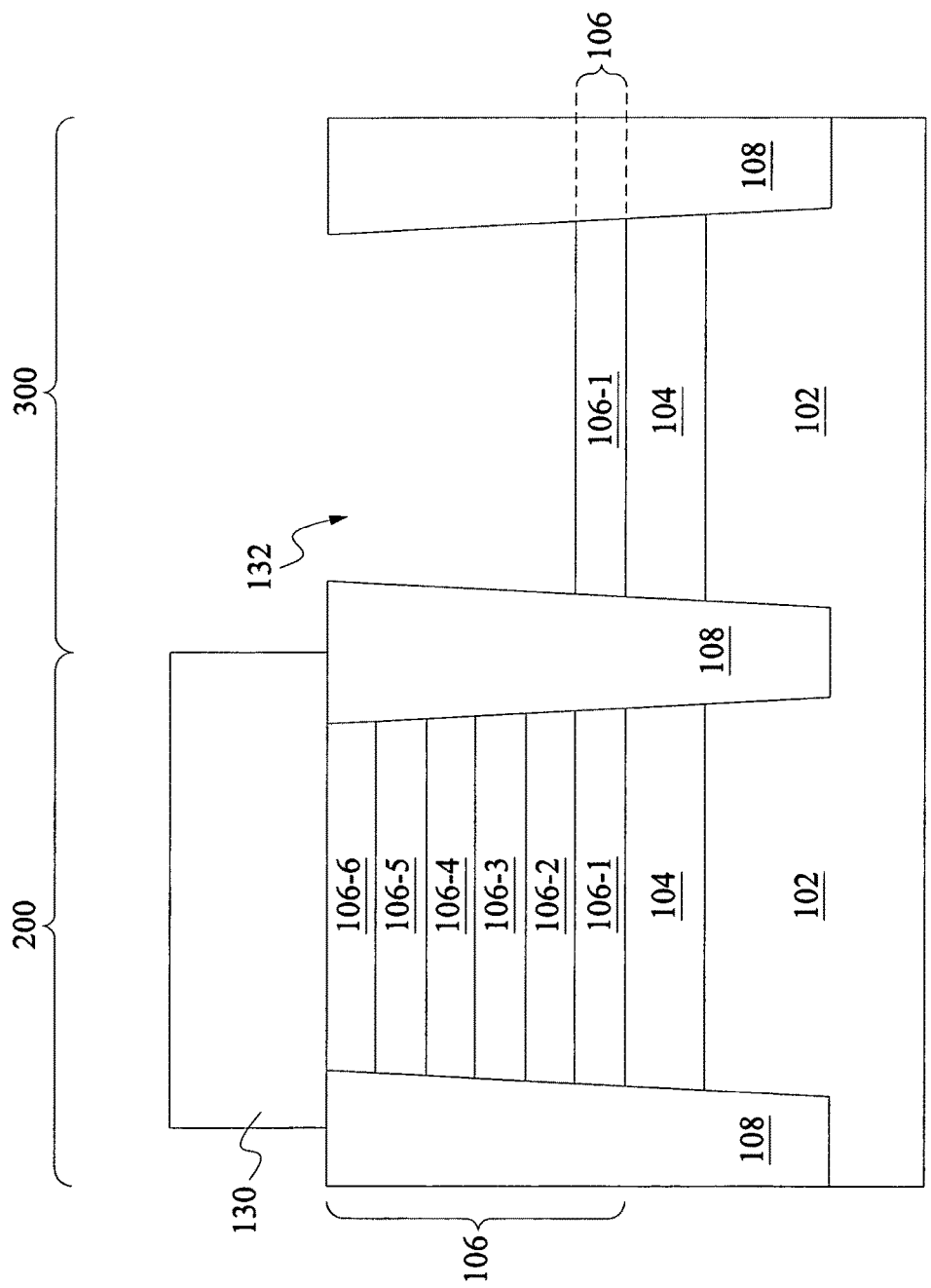

FIG. 21 illustrates the structure after the removal process 160 has removed the desired number of TMD sublayers from the second region 300 to form the trench 132 and to leave the desired thickness of the TMD layer 106 in the second region 300.

Figure 22:
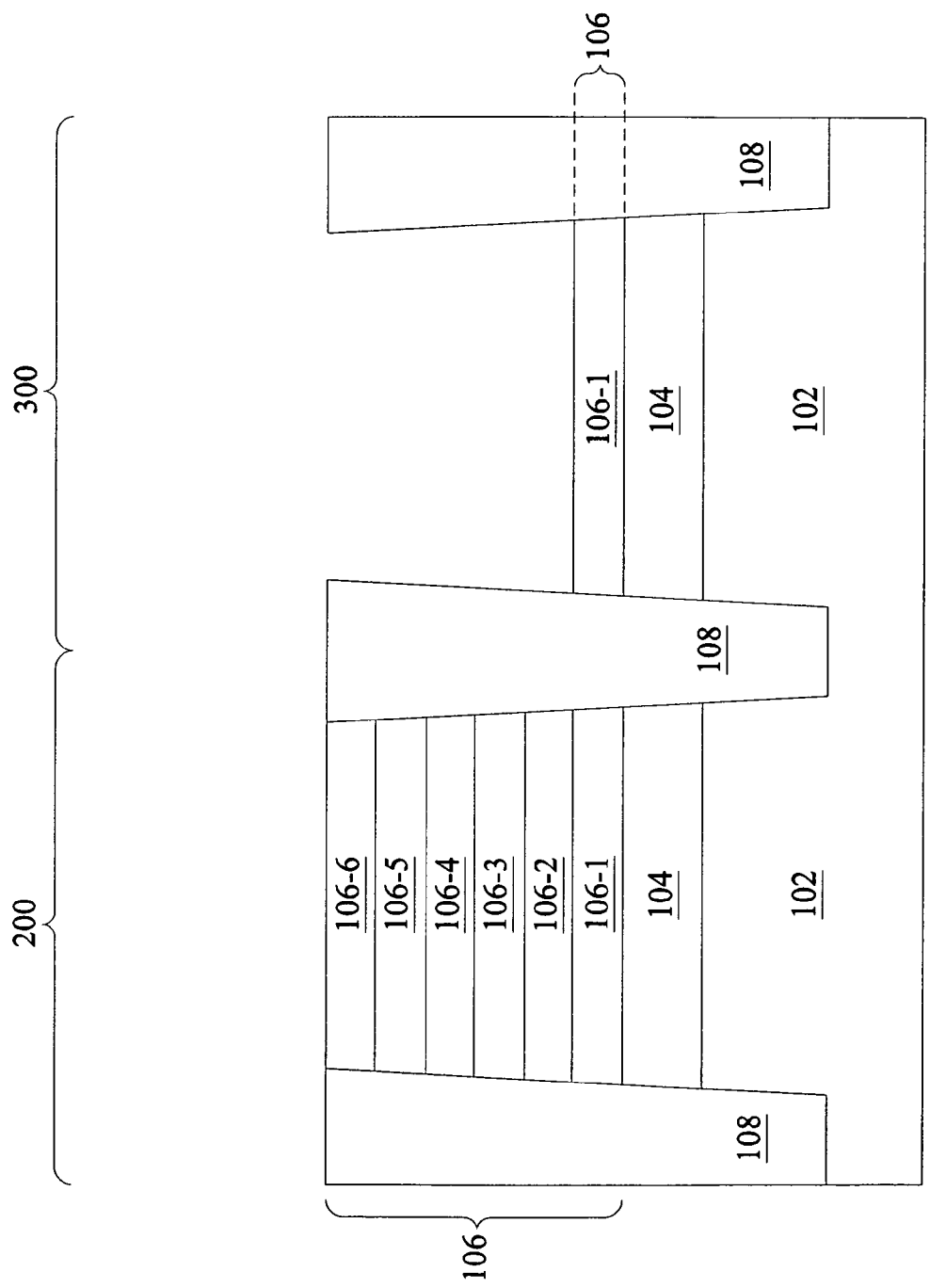
Figure 23:
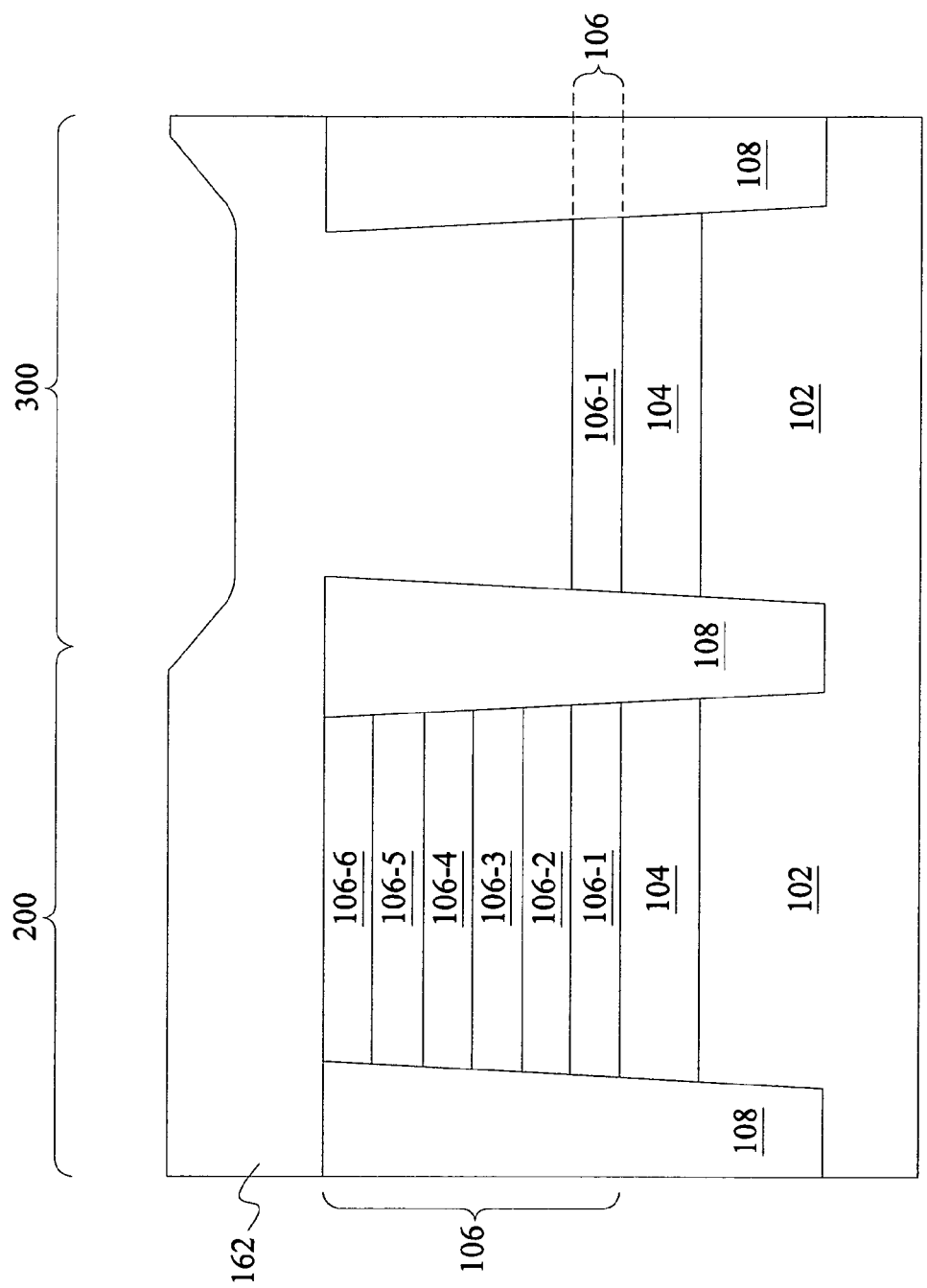

FIG. 22 illustrates the removal of the mask layer 130 from the first region 200. The mask layer 130 may be removed by a suitable process, such as an etch process or an ashing process. FIG. 23 illustrates the formation of the mask layer 162 in the trench 132 and over the first region 200. The mask layer 162 may be similar to the mask layer 130 and the description is not repeated herein.

Figure 24:
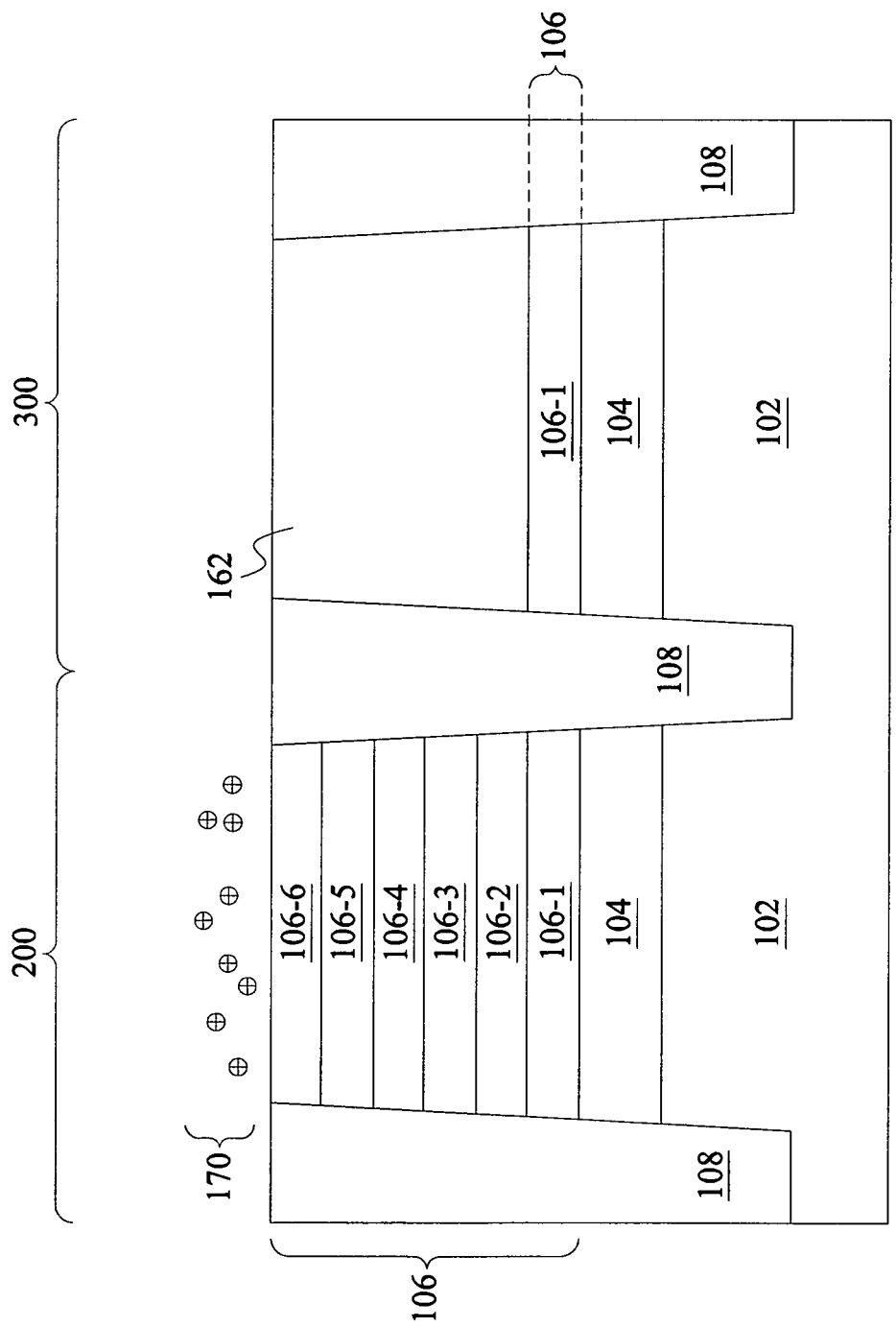

FIG. 24 illustrates the removal of excess portions of the mask layer 162 and a removal process 170 being performed on the exposed TMD layer 106 in the first region 200. The excess portions of the mask layer 162 may be removed by a planarization process, such as a CMP, to form a top surface of the mask layer 162 coplanar with top surfaces of the isolation regions 108. The removal process 170 is similar to the removal process 140 described above in FIGS. 9, 10, and 11A-11D, and the description is not repeated herein.

Figure 25:
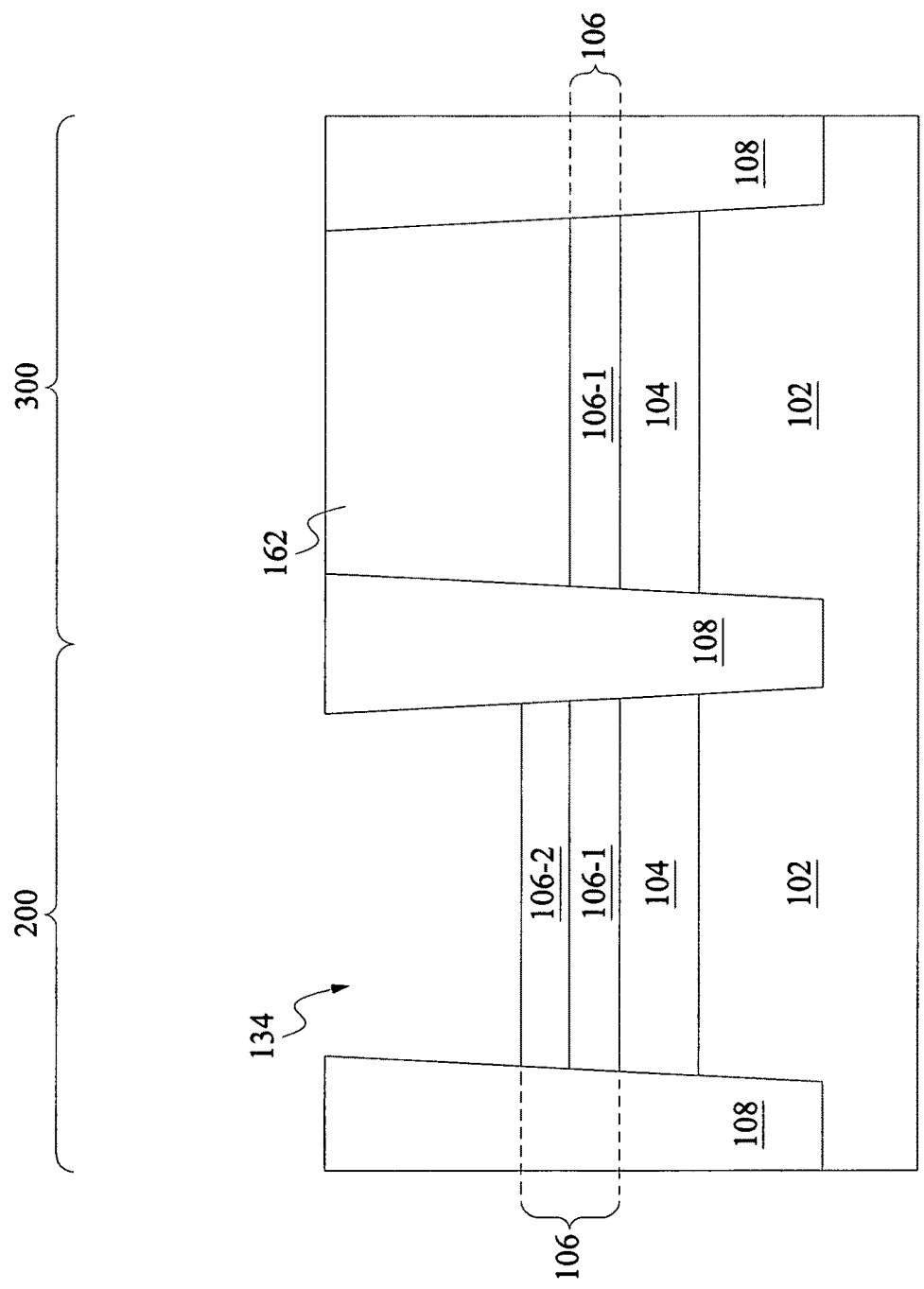

FIG. 25 illustrates the structure after the removal process 170 has removed the desired number of TMD sublayers from the first region 200 to form the trench 134 and to leave the desired thickness of the TMD layer 106 in the first region 200.

Figure 26:
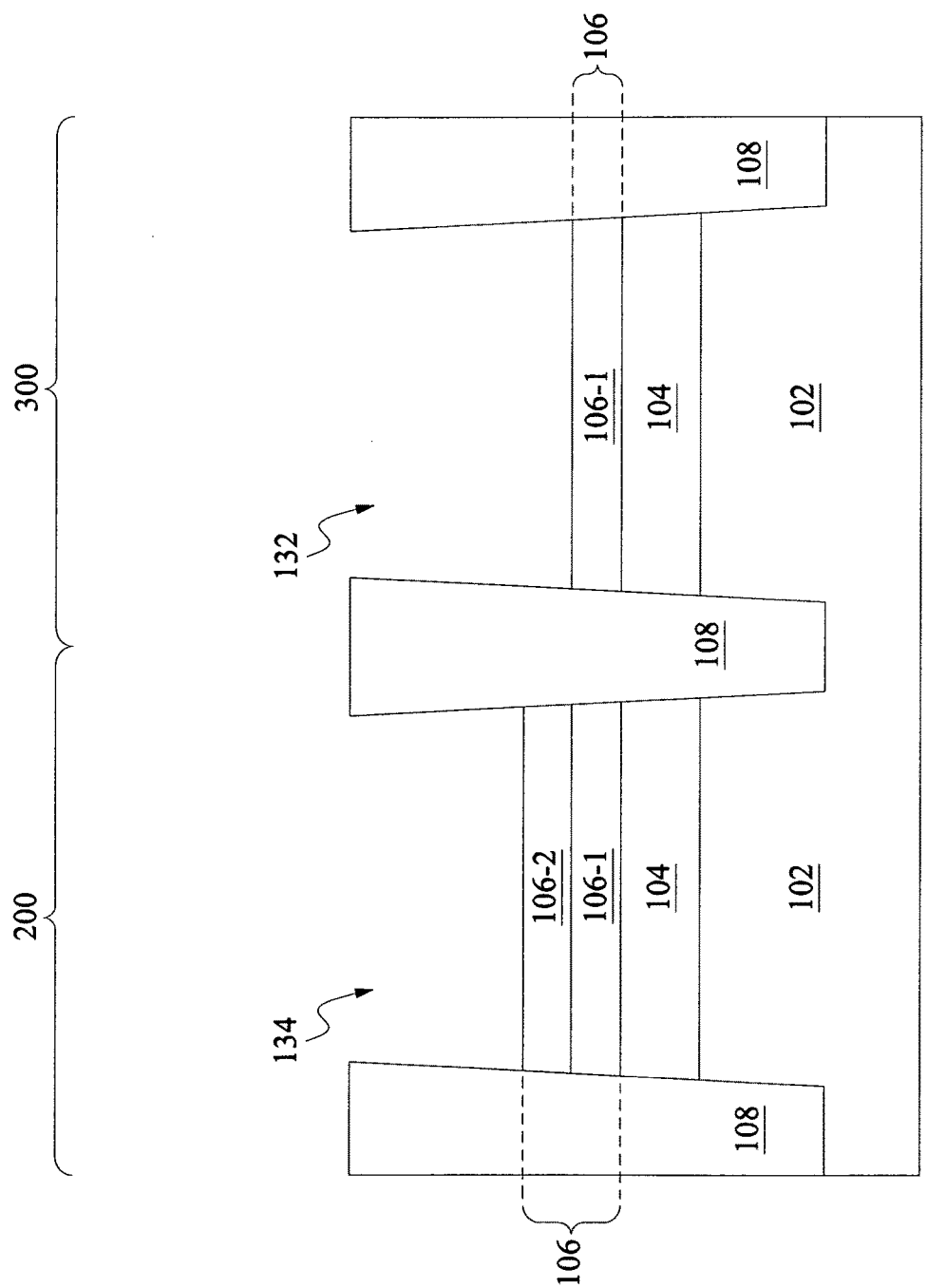

FIG. 26 illustrates the removal of the mask layer 162 from the second region 300. The mask layer 162 may be removed by a suitable process, such as an etch process or an ashing process.

Figure 27:
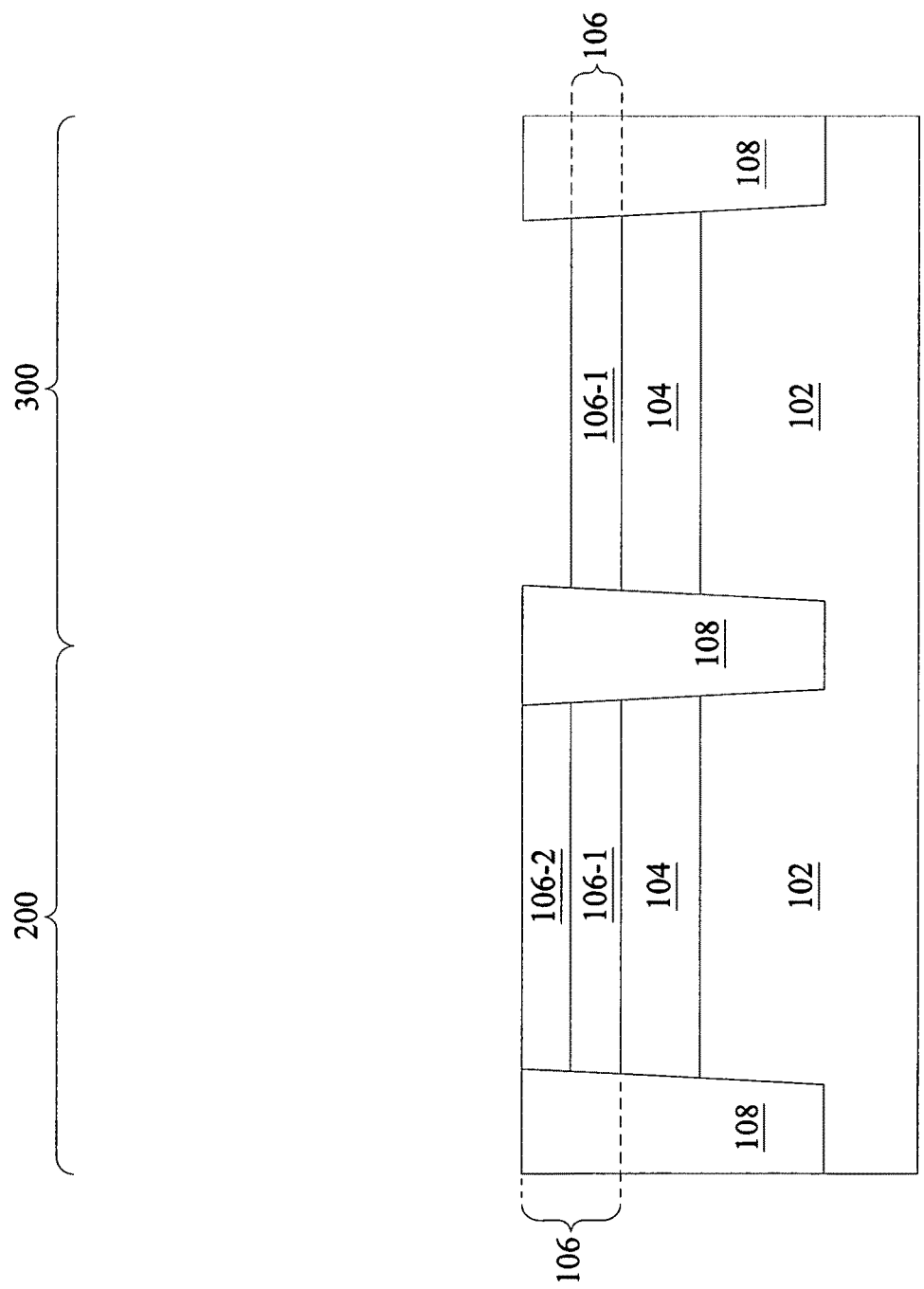

In FIG. 27, the isolation regions 108 are recessed. In some embodiments, the isolation regions 108 can be recessed by an etch process, and in some embodiments, by a planarization process, such as a CMP, to remove any excess isolation regions 108 material and form top surfaces for the isolation regions 108 that are coplanar with the highest TMD sublayer (see TMD sublayer 106-2 in FIG. 27).

Figure 28:
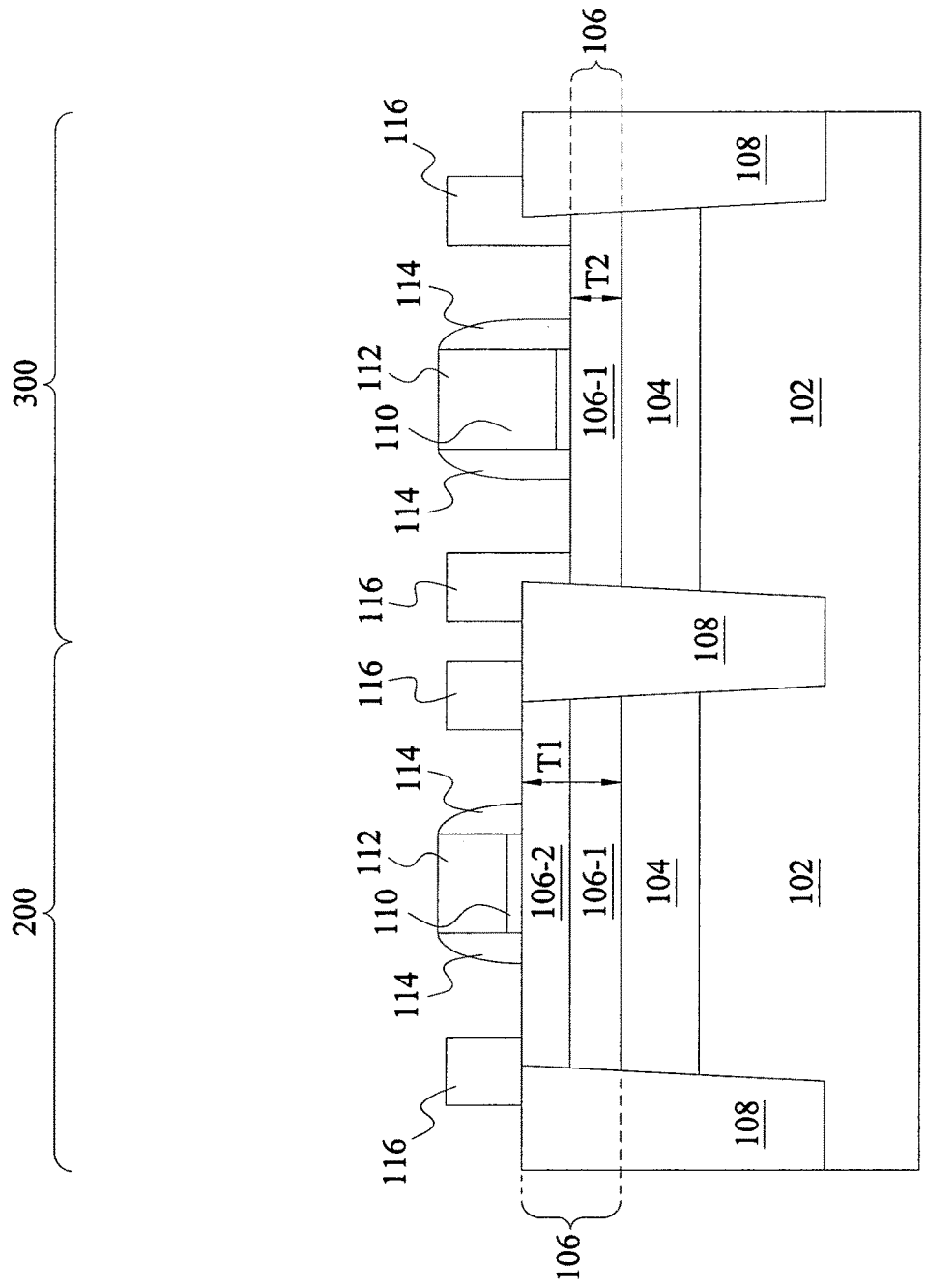

FIG. 28 illustrates the structure after the formation of gate stacks, gate spacers 114, and contacts 116. The formation and materials of these structures are similar to that described above in FIGS. 18, 16, and 1A and the descriptions are not repeated herein. In this embodiment, the contacts 116 physically contact the top surface the TMD layers 106.

Figure 29:
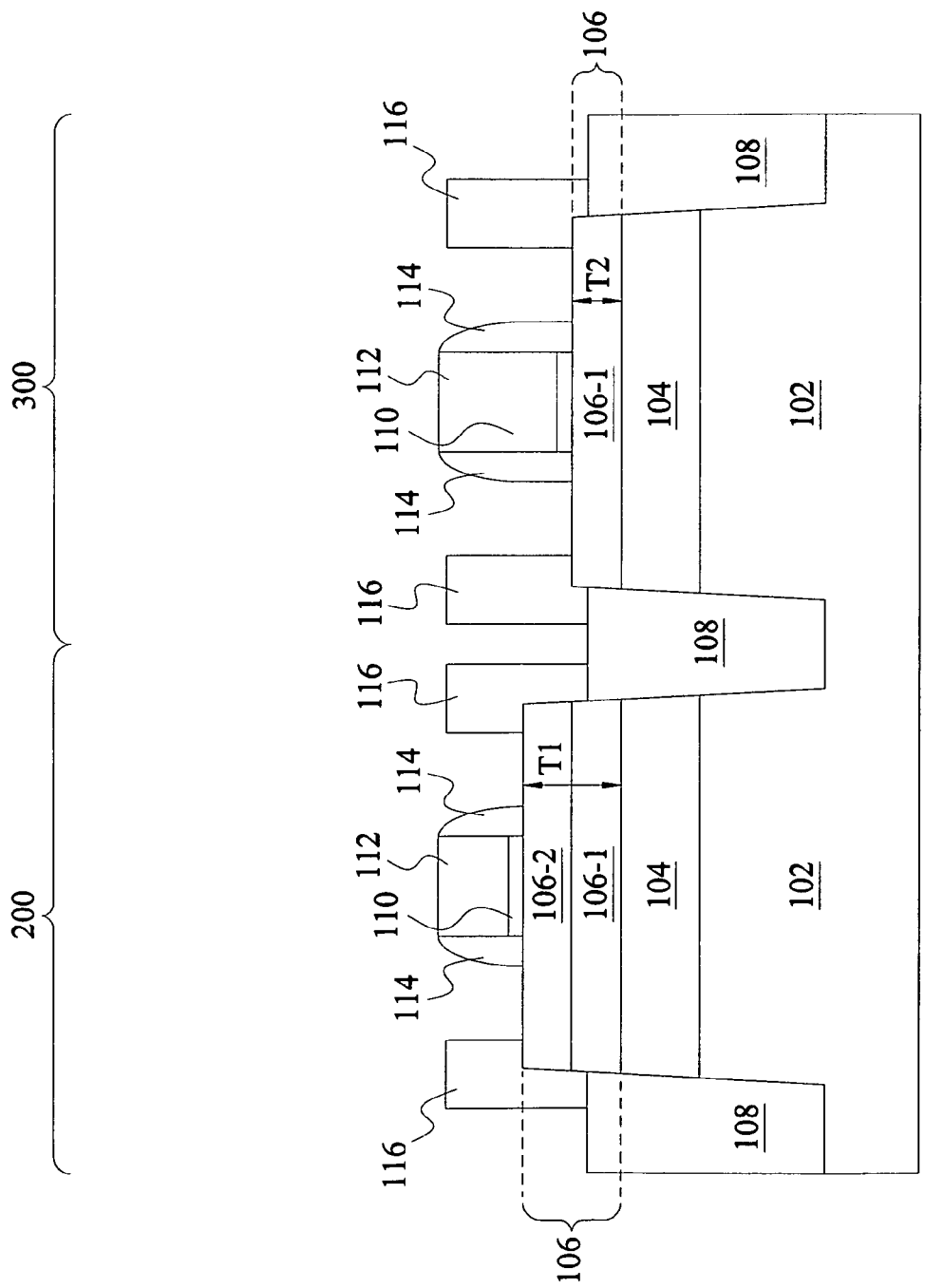
FIG. 29 is cross-sectional view of a device structure in accordance with some embodiments.

FIG. 29 is cross-sectional view of a device structure in accordance with some embodiments. This embodiment is similar to the embodiment in FIG. 28 except that isolation regions 108 are further recessed as described above in FIG. 17. The formation and materials of these structures are similar to that described above in FIGS. 17 and 18 and the descriptions are not repeated herein. In this embodiment, the contacts 116 physically contact both the top surface and the exposed sidewalls of the TMD layers 106 due to the further recessing of the isolation regions 108. The conductivity of the contacts 116 at the sidewall/edge of the TMD layer 106 is higher than that at the top surface of the TMD layer 106, and thus, the exposed edges may further enhance the on-state current of the transistors in the first region 200 and the second region 300.

Embodiments may achieve advantages. In particular, embodiments such as those disclosed herein have channels formed of various thicknesses of a 2-D material layer. The 2-D material layer may be a TMD material layer. It has been found that the value of the energy band gap of the TMD layer in each transistor strongly depends on the thickness of the TMD layer. Hence, device characteristics which are affected by the energy band gap can be adjusted in each transistor separately even while these devices are formed on the same die/chip. These characteristics include threshold voltage, on-state current, the ratio of (on-state current/off-state current), and contact conductivity. The overall performance of the integrated circuit including the devices can be further optimized with the embodiments of this disclosure.

For example, in some embodiments, a TMD layer with a first thickness is formed on a surface of a substrate. The TMD layer may include a plurality of TMD sublayers and may be formed in a plurality of regions. The TMD layers can be removed with a sublayer-by-sublayer process for each of the regions. In some embodiments, mask layers and separate removal processes can allow for each of the regions to end up with different numbers of remaining TMD sublayers, and thus, the different regions of the die/chip can have different thicknesses of transistor channels.

An embodiment is a structure including a first active device in a first region of a substrate, the first active device including a first layer of a two-dimensional (2-D) material, the first layer having a first thickness, and a second active device in a second region of the substrate, the second active device including a second layer of the 2-D material, the second layer having a second thickness, the 2-D material including a transition metal dichalcogenide (TMD), the second thickness being different than the first thickness.

Implementations may include one or more of the following features. The structure where the first active device is a first field-effect transistor, and where a channel of the first field-effect transistor is the first layer of the 2-D material, where the second active device is a second field-effect transistor, and where a channel of the second field-effect transistor is the second layer of the 2-D material. The structure further including a first isolation region adjoining and between the first layer and the second layer of the 2-D material, a first gate over the first layer of the 2-D material, a second gate over the second layer of the 2-D material, a first contact and a second contact over the first layer of the 2-D material and adjacent the first gate, and a third contact and a fourth contact over the second layer of the 2-D material and adjacent the second gate. The structure where the first contact is contacting the first layer of the 2-D material and the first isolation region. The structure where the third contact is contacting a top surface of the second layer of the 2-D material and a top surface and sidewall of first isolation region. The structure where a top surface of the first isolation region is coplanar with a top surface of the first layer of the 2-D material, and where the top surface of the first isolation region is above a top surface of the second layer of the 2-D material. The structure where the first layer includes multiple sublayers of the 2-D material, and where the second layer is a single sublayer of the 2-D material. The structure further including an insulator layer on the substrate, the first layer of the 2-D material and the second layer of 2-D material being on the insulator layer. The structure where the first layer of the 2-D material and the second layer of 2-D material are directly adjoining a top surface of the substrate. The structure where the 2-D material includes $MoS_2$, $WS_2$, $WSe_2$, $MoSe_2$, $MoTe_2$, $WTe_2$, or a combination thereof.

Another embodiment is a method including depositing a transition metal dichalcogenide (TMD) material onto a substrate, patterning the TMD material into a first TMD layer of a first thickness and a second TMD layer of a second thickness, the first thickness being different than the second thickness, forming a first gate stack over the first TMD layer, and forming a second gate stack over the second TMD layer.

Implementations may include one or more of the following features. The method where the depositing the transition metal dichalcogenide (TMD) material further includes depositing a plurality of stacked, horizontally orientated TMD sublayers. The method where the first TMD layer has a different number of TMD sublayers than the second TMD layer. The method where the patterning the TMD material further includes: forming a mask layer over the first TMD layer with the second TMD layer being exposed through the mask layer, and removing more than one of the TMD sublayers of the second TMD layer in a sublayer-by-sublayer process to form the second TMD layer of the second thickness. The method where the patterning the TMD material further includes forming isolation regions surrounding sidewalls of the first TMD layer and the second TMD layer, forming a mask layer over the first TMD layer, the second TMD layer being exposed through the mask layer, performing a first plasma treatment to form a defect in a first TMD sublayer of the second TMD layer, the first TMD sublayer being a topmost TMD sublayer of the second TMD layer, and performing a first etch process to laterally etch the defected first TMD sublayer of the second TMD layer starting at the defect, the first etch process removing the first TMD sublayer of the second TMD layer and stopping on a top surface of a second TMD sublayer of the second TMD layer, the second TMD sublayer being a nearest underlying TMD sublayer of the second TMD layer. The method where the patterning the TMD material further includes removing the mask layer to expose the first TMD layer, performing a second plasma treatment to form a defect in a third TMD sublayer of the first TMD layer and a defect in the second TMD sublayer of the second TMD layer, the third TMD sublayer being a topmost TMD sublayer of the first TMD layer, and performing a second etch process to laterally etch the defected third sublayer and the defected second TMD sublayer starting at the defects, the second etch process removing the third TMD sublayer and the second TMD sublayer and stopping on top surfaces of a fourth TMD sublayer of the first TMD layer and a fifth TMD sublayer of the second TMD layer, the fourth TMD sublayer being a nearest underlying TMD sublayer of the first TMD layer, the fifth TMD sublayer being a nearest underlying TMD sublayer of the second TMD layer.

A further embodiment is a method including forming a plurality of transition metal dichalcogenide (TMD) layers over a substrate, each of the TMD layers having a major surface parallel to a major surface of the substrate, etching a trench through the plurality of TMD layers to form a first plurality of TMD layers and a second plurality of TMD layers, the first plurality of TMD layers being on an opposite side of the trench than the second plurality of TMD layers, depositing an insulating material in the trench to form an isolation region, removing a first number of layers from the first plurality of TMD layers and a second number of layers from the second plurality of TMD layers, the first number being different than the second number, forming a first gate stack on the remaining layers of the first plurality of TMD layers, forming a second gate stack on the remaining layers of the second plurality of layers, forming a first conductive contact on the remaining layers of the first plurality of TMD layers, and forming a second conductive contact on the remaining layers of the second plurality of TMD layers.

Implementations may include one or more of the following features. The method where the removing the first number of layers from the first plurality of TMD layers and the second number of layers from the second plurality of TMD layers further includes forming a first mask layer over the first plurality of TMD layers with the second plurality of TMD layers being exposed through the first mask layer, removing the second number of TMD layers from the second plurality of TMD layers in a layer-by-layer process, removing the first mask layer, forming a second mask layer over the remaining layers of the second plurality of TMD layers with the first plurality of TMD layers being exposed through the second mask layer, removing the first number of TMD layers from the first plurality of TMD layers in a layer-by-layer process, and removing the second mask layer. The method where the removing the first number of layers from the first plurality of TMD layers and the second number of layers from the second plurality of TMD layers further includes forming a first mask layer over the first plurality of TMD layers with the second plurality of TMD layers being exposed through the first mask layer, removing a third number of TMD layers from the second plurality of TMD layers in a layer-by-layer process, the third number being a difference between the first number and the second number, removing the first mask layer, and removing the first number of TMD layers from the first plurality of TMD layers and the remaining layers of the second plurality of TMD layers in a layer-by-layer process. The method where the first conductive contact is contacting the remaining layers of the first plurality of TMD layers and the isolation region, and where the second conductive contact is contacting the remaining layers of the second plurality of TMD layers and the isolation region. The method where before removing the first number of layers from the first plurality of TMD layers and the second number of layers from the second plurality of TMD layers, planarizing the insulating material, wherein after the planarizing the insulating material, at least one of the first plurality of TMD layer or the second plurality of TMD layers has a sidewall exposed over a top surface of the insulating material, and removing the at least one of the first plurality of TMD layer or the second plurality of TMD layers with the exposed sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing a transition metal dichalcogenide (TMD) material onto a substrate;
    etching a trench in the TMD material to form a first plurality of TMD sublayers and a second plurality of TMD sublayers having the same number of sublayers;
    forming a mask layer over the second plurality of TMD sublayers, the first plurality of TMD sublayers being exposed through the mask layer;
    removing one or more of a first number of sublayers from the first plurality of TMD sublayers; removing the mask layer;

removing one or more of a second number of sublayers from the second plurality of TMD sublayers, the second number different from the first number;

forming a first gate stack over the remaining first plurality of TMD sublayers; and forming a second gate stack over the remaining second plurality of TMD sublayers.

2. The method of claim 1, wherein the depositing the transition metal dichalcogenide (TMD) material further comprises depositing a plurality of stacked, horizontally orientated TMD sublayers.

3. The method of claim 2, wherein the removing one or more of a second number of layers from the second plurality of TMD sublayers comprises:

forming a second mask layer over the first plurality of TMD sublayers with the second plurality of TMD sublayers being exposed through the second mask layer; and removing more than one of the second plurality of TMD sublayers in a sublayer-by-sublayer process.

4. The method of claim 3, further comprising:

forming isolation regions surrounding sidewalls of the first plurality of TMD sublayers and the second plurality of TMD sublayers;

performing a first plasma treatment to form a defect in a first TMD sublayer of the second plurality of TMD sublayers, the first TMD sublayer being a topmost TMD sublayer of the second plurality of TMD sublayers; and performing a first etch process to laterally etch the defected first TMD sublayer of the second plurality of TMD sublayers starting at the defect, the first etch process removing the first TMD sublayer of the second plurality of TMD sublayers and stopping on a top surface of a second TMD sublayer of the second plurality of TMD sublayers, the second TMD sublayer being a nearest underlying TMD sublayer of the second plurality of TMD sublayers.

5. The method of claim 4, further comprising:

removing the second mask layer to expose the first plurality of TMD sublayers;

performing a second plasma treatment to form a defect in a third TMD sublayer of the first plurality of TMD sublayers and a defect in the second TMD sublayer of the second plurality of TMD sublayers, the third TMD sublayer being a topmost TMD sublayer of the first plurality of TMD sublayers; and performing a second etch process to laterally etch the defected third TMD sublayer and the defected second TMD sublayer starting at the defects, the second etch process removing the third TMD sublayer and the second TMD sublayer and stopping on top surfaces of a fourth TMD sublayer of the first plurality of TMD sublayers and a fifth TMD sublayer of the second plurality of TMD sublayers, the fourth TMD sublayer being a nearest underlying TMD sublayer of the first plurality of TMD sublayers, the fifth TMD sublayer being a nearest underlying TMD sublayer of the second plurality of TMD sublayers.

6. A method comprising:

forming a plurality of transition metal dichalcogenide (TMD) layers over a substrate, each of the TMD layers having a major surface parallel to a major surface of the substrate;

etching a trench through the plurality of TMD layers to form a first plurality of TMD layers and a second plurality of TMD layers, the first plurality of TMD layers being on an opposite side of the trench than the second plurality of TMD layers;

depositing an insulating material in the trench to form an isolation region;

removing a first number of layers from the first plurality of TMD layers and a second number of layers from the second plurality of TMD layers, the first number being different than the second number;

forming a first gate stack on the remaining layers of the first plurality of TMD layers;

forming a second gate stack on the remaining layers of the second plurality of TMD layers;

forming a first conductive contact on the remaining layers of the first plurality of TMD layers;

forming a second conductive contact on the remaining layers of the second plurality of TMD layers; and before removing the first number of layers from the first plurality of TMD layers and the second number of layers from the second plurality of TMD layers, planarizing the insulating material, wherein after the planarizing the insulating material, at least one of the first plurality of TMD layers or the second plurality of TMD layers has a sidewall exposed over a top surface of the insulating material.

7. The method of claim 6, wherein the removing the first number of layers from the first plurality of TMD layers and the second number of layers from the second plurality of TMD layers further comprises:

forming a first mask layer over the first plurality of TMD layers with the second plurality of TMD layers being exposed through the first mask layer;

removing the second number of TMD layers from the second plurality of TMD layers in a layer-by-layer process;

removing the first mask layer;

forming a second mask layer over the remaining layers of the second plurality of TMD layers with the first plurality of TMD layers being exposed through the second mask layer;

removing the first number of TMD layers from the first plurality of TMD layers in a layer-by-layer process; and removing the second mask layer.

8. The method of claim 6, wherein the removing the first number of layers from the first plurality of TMD layers and the second number of layers from the second plurality of TMD layers further comprises:

forming a first mask layer over the first plurality of TMD layers with the second plurality of TMD layers being exposed through the first mask layer;

removing a third number of the TMD layers from the second plurality of TMD layers in a layer-by-layer process, the third number being a difference between the first number and the second number;

removing the first mask layer; and removing the first number of TMD layers from the first plurality of TMD layers and the remaining layers of the second plurality of TMD layers in a layer-by-layer process.

9. The method of claim 6, wherein the first conductive contact is contacting the remaining layers of the first plurality of TMD layers and the isolation region, and wherein the second conductive contact is contacting the remaining layers of the second plurality of TMD layers and the isolation region.

10. The method of claim 6 further comprising
removing the at least one of the first plurality of TMD layers or the second plurality of TMD layers with the exposed sidewall.

11. The method of claim 6, wherein the TMD layers comprise $MoS_2$, $WS_2$, $WSe_2$, $MoSe_2$, $MoTe_2$, $WTe_2$, or a combination thereof.

12. A method comprising:
forming a first active device in a first region of a substrate, the first active device comprising a first layer of a two-dimensional (2-D) material, the first layer having a first thickness; and
forming a second active device in a second region of the substrate, the second active device comprising a second layer of the 2-D material, the second layer having a second thickness, the 2-D material comprising a transition metal dichalcogenide (TMD), the second thickness being different than the first thickness;
forming a first isolation region adjoining and between the first layer and the second layer of the 2-D material; and
recessing the first isolation region to expose a sidewall of one of the first layer and the second layer of the 2-D material.

13. The method of claim 12, wherein the first active device is a first field-effect transistor, and wherein a channel of the first field-effect transistor is the first layer of the 2-D material, wherein the second active device is a second field-effect transistor, and wherein a channel of the second field-effect transistor is the second layer of the 2-D material.

14. The method of claim 13 further comprising:
forming a first gate over the first layer of the 2-D material;
forming a second gate over the second layer of the 2-D material;
forming a first contact and a second contact over the first layer of the 2-D material and adjacent the first gate; and
forming a third contact and a fourth contact over the second layer of the 2-D material and adjacent the second gate.

15. The method of claim 14, wherein the first contact is contacting the first layer of the 2-D material and the first isolation region.

16. The method of claim 14, wherein the third contact is contacting a top surface and a sidewall of the second layer of the 2-D material and a top surface of the first isolation region.

17. The method of claim 14 further comprising:
before recessing the first isolation region, planarizing the first isolation region to have a top surface coplanar with a top surface of the first layer of the 2-D material, and wherein after the planarizing, the top surface of the first isolation region is above a top surface of the second layer of the 2-D material.

18. The method of claim 12, wherein the first layer comprises multiple sublayers of the 2-D material, and wherein the second layer is a single sublayer of the 2-D material.

19. The method of claim 12, wherein the substrate comprising an insulator layer, the first layer of the 2-D material and the second layer of the 2-D material being on the insulator layer.

20. The method of claim 12, wherein the 2-D material comprises $MoS_2$, $WS_2$, $WSe_2$, $MoSe_2$, $MoTe_2$, $WTe_2$, or a combination thereof.

21. The method of claim 1, further comprising depositing an insulating material in the trench to form an isolation region.

* * * * *